United States Patent [19]

Smayling et al.

[11] Patent Number: 5,515,319

[45] Date of Patent: May 7, 1996

[54] NON-VOLATILE MEMORY CELL AND LEVEL SHIFTER

[75] Inventors: Michael C. Smayling, Missouri City, Tex.; Iano D'Arrigo, Cannes, France; Giovanni Santin, Rufina, Italy; Georges Falessi, La Gaude, France; Mousumi Bhat, Austin, Tex.

[73] Assignee: Texas Instruments Incorporated, Dallas, Tex.

[21] Appl. No.: 135,935

[22] Filed: Oct. 12, 1993

[51] Int. Cl.$^6$ ........................................... G11C 7/00
[52] U.S. Cl. ............................ 365/185.27; 365/185.16; 365/185.06
[58] Field of Search .................... 365/185, 900, 365/189.01, 218; 257/314, 315

[56] References Cited

U.S. PATENT DOCUMENTS

| | | | |
|---|---|---|---|
| 4,016,588 | 4/1977 | Ohya et al. | 365/185 |
| 4,742,492 | 5/1988 | Smayling et al. | 365/218 |
| 4,888,735 | 12/1989 | Lee et al. | 365/185 |
| 5,016,215 | 5/1991 | Tigelaar | 365/185 |
| 5,060,195 | 10/1991 | Gill et al. | 365/900 |
| 5,097,303 | 3/1992 | Taguchi | 365/185 |
| 5,157,281 | 10/1992 | Santin et al. | 307/296.8 |
| 5,243,559 | 9/1993 | Murai | 365/185 |
| 5,287,318 | 2/1994 | Kuki et al. | 365/900 |
| 5,341,342 | 8/1994 | Brahmbhatt | 365/900 |
| 5,371,706 | 12/1994 | Urentz et al. | 365/185 |

Primary Examiner—Tan T. Nguyen
Attorney, Agent, or Firm—Ira S. Matsil; James C. Kesterson; Richard L. Donaldson

[57] ABSTRACT

A non-volatile memory cell 10 is disclosed herein. The cell is formed in a first semiconductor region 12 of a first conductivity type. A second semiconductor region 14 of a second conductivity type formed over the first semiconductor region 12. A third semiconductor region 16 of the first conductivity type formed over the second semiconductor region 14. In the preferred embodiment, the second and third regions 14 and 16 are well regions formed within the first region 12. Other regions such as epitaxially grown layers can also be used. First and second source/drain regions 18 and 20 are formed within the third semiconductor region 16. These second source/drain regions 18 and 20 are separated by a channel region 22. A floating gate 26 overlies at least a portion of the channel region 22 while a control gate 30 overlies the floating gate 26.

17 Claims, 16 Drawing Sheets

NON-VOLATILE MEMORY CELL AND LEVEL SHIFTER

FIELD OF THE INVENTION

This invention generally relates to semiconductor devices and specifically to a non-volatile memory cell as well as a level shifter which may be used together.

BACKGROUND OF THE INVENTION

A read-only memory (ROM) is a type of memory in which data can be permanently stored, for example, by blowing metallic links during programming thereof. Such type of memory can be conventionally accessed at specific locations to read the programmed contents thereof. A much more versatile type of ROM is the electrically programmable read-only memory (EPROM) which can be electrically programmed to store data. Some versions of these devices store data permanently; others, however, can be erased with ultraviolet light or an electrical current.

The construction of an EPROM cell is similar to that of a field effect transistor, but additionally includes a floating gate between the gate conductor and the conduction channel of the transistor. During programming to store a desired logic state, electrons flowing in the conduction channel are attracted by and trapped in the floating gate. This condition increases the threshold voltage of the transistor, thereby rendering it cutoff in response to normal read operation voltages. Hence, during reading of a transistor cell so programmed, the transistor will remain nonconductive and thus represent a high impedance between the source and drain. On the other hand, cells which have not been programmed will remain conductive in response to normal read operation voltages. In this manner, the memory can be programmed to binary logic states. The memory can also be utilized for analog application where the amount of charge stored on the floating gate is varied with more than just two discrete levels.

SUMMARY OF THE INVENTION

Other objects and advantages will be obvious, and will in part appear hereinafter and will be accomplished by the present invention which provides a method and apparatus for a non-volatile memory cell.

A non-volatile memory cell is disclosed herein. The cell is formed in a first semiconductor region of a first conductivity type. A second semiconductor region of a second conductivity type formed over the first semiconductor region. A third semiconductor region of the first conductivity type formed over the second semiconductor region. In the preferred embodiment, the second and third regions are well regions formed within the first region. Other regions such as epitaxially grown layers can also be used. First and second source/drain regions are formed within the third semiconductor region. These second source/drain regions are separated by a channel region. A floating gate overlies at least a portion of the channel region while a control gate overlies the floating gate.

One advantage of the invention is that the source/drain diffusions can be driven with both positive and negative voltages. These lower voltages are both easier to generate and control and less likely to disturb adjacent cells during write and erase operations.

BRIEF DESCRIPTION OF THE DRAWINGS

The above features of the present invention will be more clearly understood from consideration of the following descriptions in connection with accompanying drawings in which.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The following is a description of the structure and method of the present invention. The preferred embodiment will be described first followed by a description of modifications. The method of using the invention will then be described.

Figure 1:
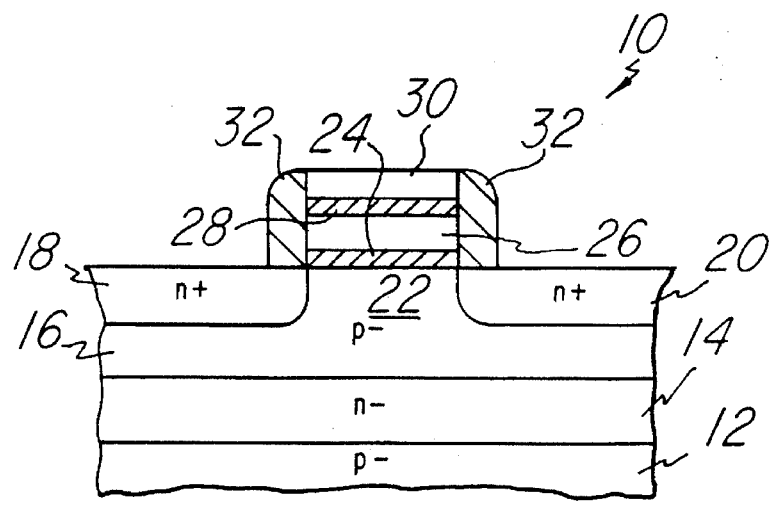
FIG. 1 is a cross-section of a floating gate transistor.

Referring first to FIG. 1, a preferred embodiment non-volatile memory cell 10 is illustrated. A first semiconductor region 12 is provided. In the preferred embodiment, semiconductor region 12 comprises p-doped silicon for an n-channel memory device. However, if p-channel memory devices are desired, each of the regions could be formed of the opposite conductivity type than illustrated in FIG. 1.

The semiconductor region 12 may comprise a semiconductor substrate. Alternatively, semiconductor region 12 may comprise a semiconductor region 12 formed on another region (not shown). The other region (not shown) may be a semiconductor layer or alternatively may be an insulating layer, for example, if silicon-on-insulator (SOI) technologies are used. In another embodiment, semiconductor region 12 may comprise a well region formed within a semiconductor region. The preferred semiconductor material is silicon but other materials such as germanium or gallium arsenide may also be used.

A second semiconductor region 14 is formed above semiconductor region 12. Semiconductor region 14 is doped to the opposite conductivity type of semiconductor region 12. For example, if semiconductor region 12 comprises p-type semiconductor, then semiconductor region 14 comprises an n-type semiconductor.

A third semiconductor region 16 is formed above semiconductor region 14. As before, semiconductor region 16 is doped to the opposite conductivity type as semiconductor region 14. In a preferred embodiment, the semiconductor region 14 comprises a well region formed within semiconductor region 12, and the semiconductor region 16 comprises a well region formed with semiconductor region 14.

First and second source/drain regions 18 and 20 are formed within semiconductor region 16. In a preferred embodiment, source/drain regions 18 and 20 comprise relatively highly doped n-type regions. However, if a p-channel device is desired, the source/drain regions 18 and 20 would comprise p-type regions. The source/drain regions 18 and 20 are separated by a channel region 22. Typically, the channel region 22 is doped to a conductivity type opposite the source/drain regions 18 and 20.

A gate dielectric layer 24 is formed over the channel region 22. The gate dielectric layer 24 may comprise an oxide layer such as silicon dioxide, a nitride layer such as silicon nitride or a combination of both such as an oxide-nitride (ON) or nitride-oxide (NO) layer or an oxide-nitride-oxide (ONO) layer.

A floating gate 26 is formed over at least a portion of channel region 22 and is insulated therefrom by the gate dielectric 24. As illustrated in FIG. 1, the floating gate 26 may extend the length of the entire channel region 22. In other words, the floating gate 26 may extend from the source 18 to the drain 20. In other embodiments, the floating gate 26 may extend over only a portion of the channel region 22. One known structure where the floating gate 26 extends over only a portion of the channel is a split gate structure. The floating gate 26 comprises a conductive material such as doped polysilicon or a metal such as aluminum.

A control gate 30 is formed over the floating gate 26 and insulated therefrom. The control gate 30 comprises a conductive material such as doped polysilicon or a metal such as aluminum. The control gate 30 may also comprise a silicide such as titanium silicide or tungsten silicide. In typical application, the control gate 30 is coupled to a word line in an array of cells.

Also illustrated in FIG. 1 are sidewall insulating regions 32. The sidewall insulating regions 32 may comprise an oxide such as silicon dioxide or a nitride such as silicon nitride.

In a preferred embodiment, the semiconductor region 14 comprises a well (or tub or tank) region formed within semiconductor region 12, and the semiconductor region 16 comprises a well region formed within semiconductor region 14. An example of this type of structure is illustrated in FIG. 2a.

Figure 2A:
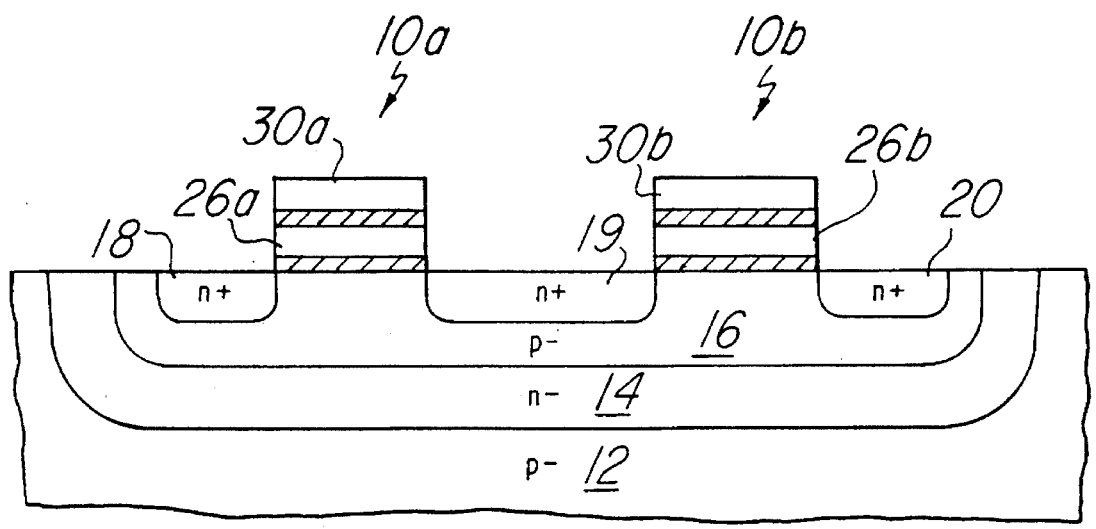
FIG. 2a is a cross-section of a floating gate transistor which is formed within well regions.

Two non-volatile memory cells 10a and 10b are illustrated in the structure of FIG. 2a. In this example, cell 10a and cell 10b share a common source/drain region 19. An advantage of forming more than one memory cell in each well 16 is a reduction of surface area. As will be discussed in more detail below, the cells 10a and 10b can be erased together.

Figure 11:
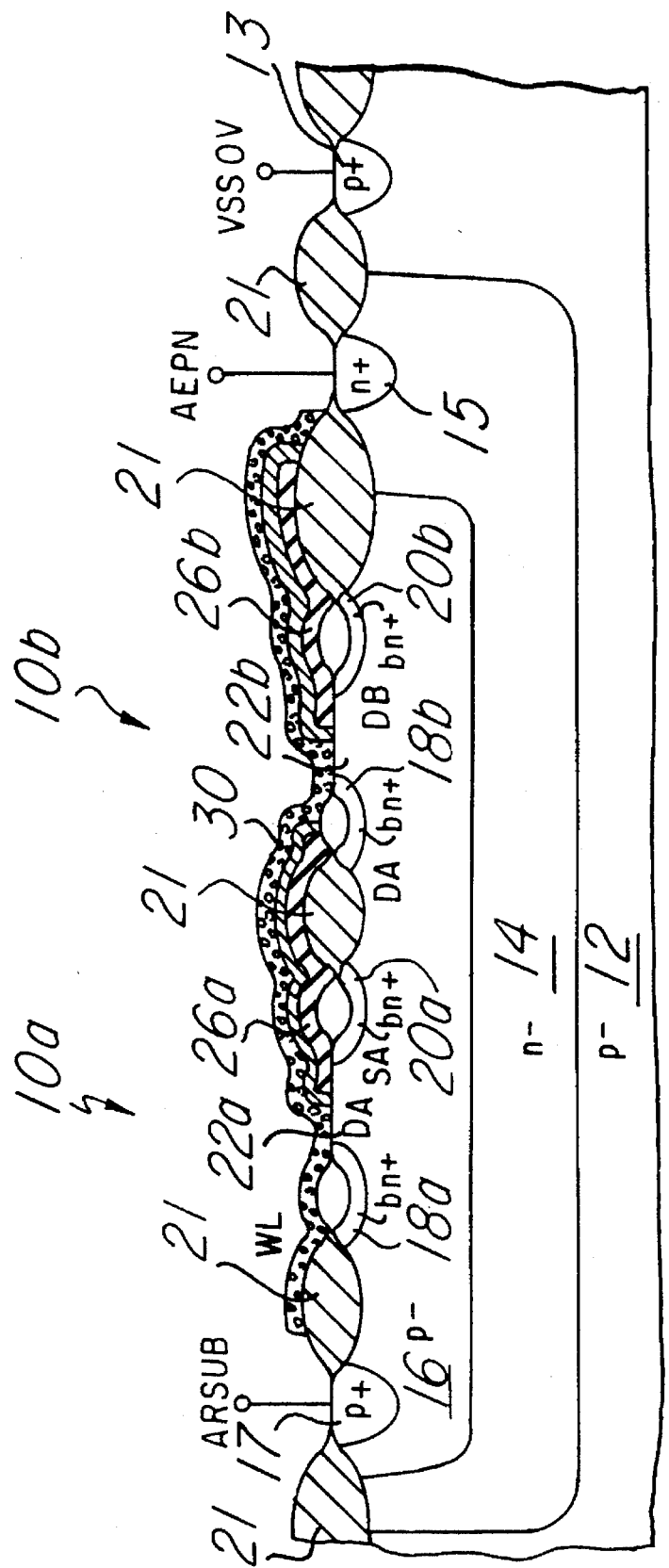
FIG. 11 is a cross-section of an alternate embodiment floating gate transistor.

An advantage of using well structures as illustrated in FIG. 2a is that electrical contacts can be made to well regions from the top surface of the device. For example, contact regions 15 and 17 are illustrated in FIG. 11. In addition, contact can be made to the first region 12 (as illustrated with contact region 13 in FIG. 11).

Figure 2B:
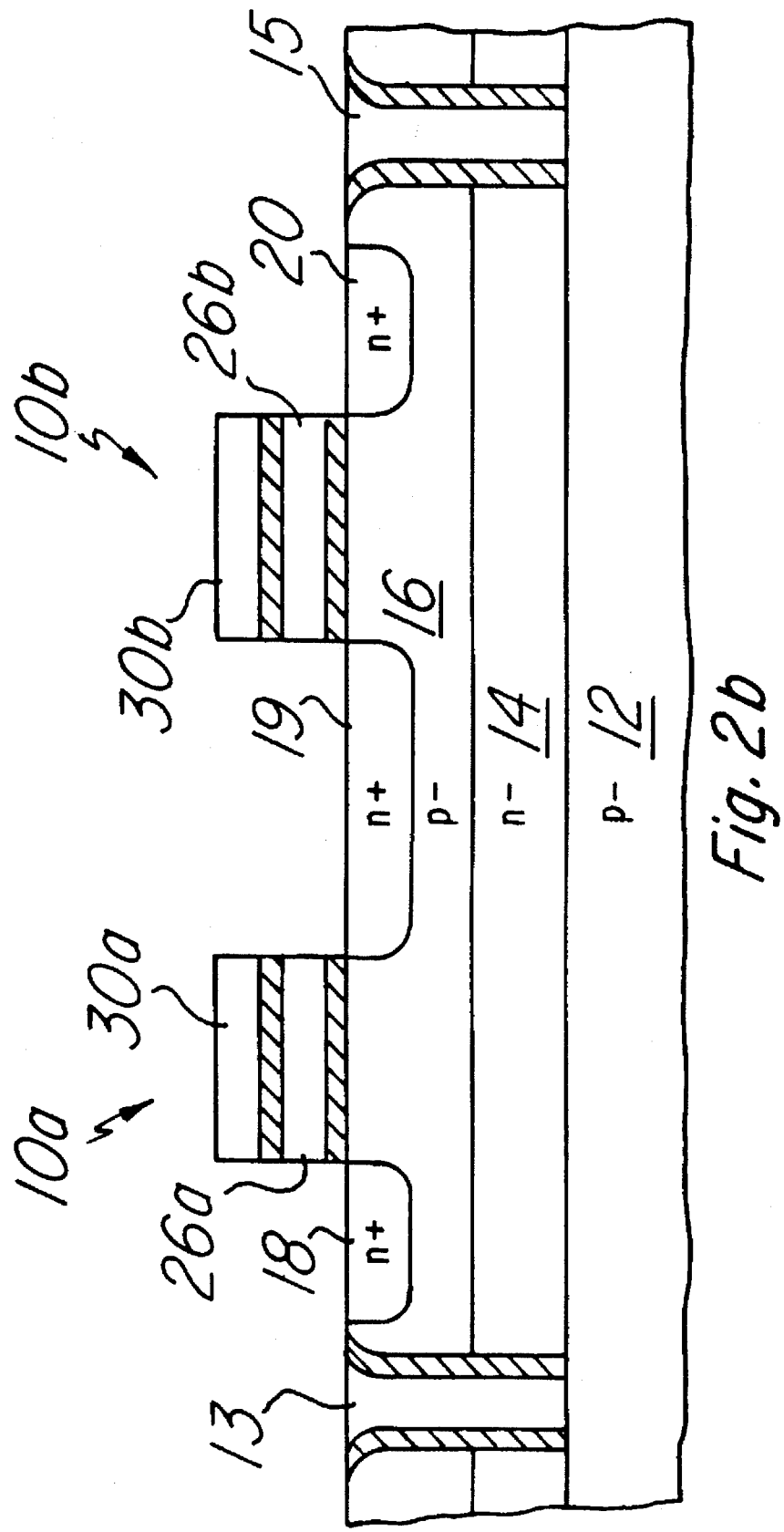
FIG. 2b is a cross-section of a floating gate transistor which is formed within semiconductor layers.

An alternative embodiment cell is illustrated in FIG. 2b. In this embodiment, the semiconductor region 14 comprises a semiconductor layer formed over semiconductor region 12 and the semiconductor region 16 comprises a semiconductor layer formed over semiconductor layer 14. These layers 14 and 16 (as well as layer 12) can comprise epitaxially grown semiconductor layers. Alternatively, the layers 14 and 16 may comprise polycrystalline semiconductor layers if the performance requirements allow this material.

In flash EEPROM applications, each of the cells formed in a common well 16 can be erased at the same time. Therefore, if a given application requires the ability to individually erase cells (i.e., erase each bit individually), only a single cell would be formed in each well 16. On the other end of the spectrum, the entire array can be put in a single well. In this embodiment, the entire array would be erased together. In a preferred embodiment, the array is segmented into a series of blocks of cells and each block is formed in a well. One example of an embodiment where this method would be useful is in a disk replacement non-volatile memory device. In this example, each sector (e.g., 512 bytes) could comprise a block and accordingly be formed in a single well.

Figure 3A:
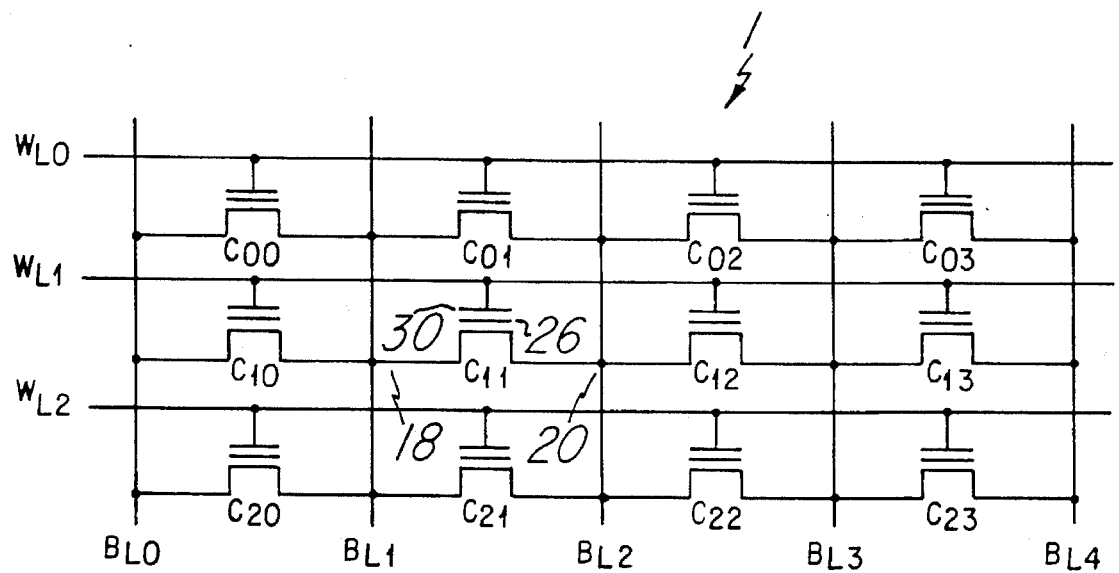
FIGS. 3a and 3b are schematic diagrams of arrays of non-volatile memory cells.

As previously discussed, the memory cells of the present invention are typically formed in a memory array. A schematic diagram of an array 1 of only twelve cells is illustrated in FIG. 3a. Typical arrays include many more memory cells. For example, it is not uncommon to have arrays of 16K cells or more.

Each of the cells $C_{00}$–$C_{23}$ in the array i may be formed in a separate well or all the cells may be formed in a single well. Typically, the number of cells formed in each well depends on the desired performance (e.g., write or erase time) and is not a functional issue.

In a typical embodiment, the array 1 of non-volatile memory cells is formed in rows and columns. Each of the cells in a column (e.g., $C_{01}$–$C_{21}$) has a first source/drain coupled to a first bitline (e.g., $BL_1$) and a second source/drain coupled to a second bitline (e.g., $BL_2$). Also, each of the cells in a row (e.g., $C_{10}$–$C_{13}$) has a gate coupled to a wordline (e.g., $WL_1$). Each cell may be comprise any of the embodiment cells described herein or variations thereof.

There are several ways to configure the cell within array 1. Each non-volatile memory cell may have the source/drain regions formed in a separate first well region. In this embodiment, there would be the same number of well regions as there are cells. In another embodiment, the source/drain regions of each cell in a column of cells are formed in a single well region. In this embodiment, the number of well regions would be the same as the number of columns. In yet another embodiment, the source/drain regions of each cell in at least two adjacent columns of cells are formed in a single well region. As an example, the cells $C_{00}$, $C_{01}$, $C_{10}$, $C_{11}$, $C_{20}$, and $C_{21}$ may be formed in one well and the cells $C_{02}$, $C_{03}$, $C_{12}$, $C_{13}$, $C_{22}$, and $C_{23}$ may be formed in a second well. (It should be noted, in this example, the cells in the column of $C_{01}$ would not share bitline BL2 with the cells in the column $C_{02}$ as illustrated in FIG. 3a.) Any number of cells can be included in each well. In the extreme case, the source/drain regions of each cell in the entire array are formed in a single well region.

Figure 3B:
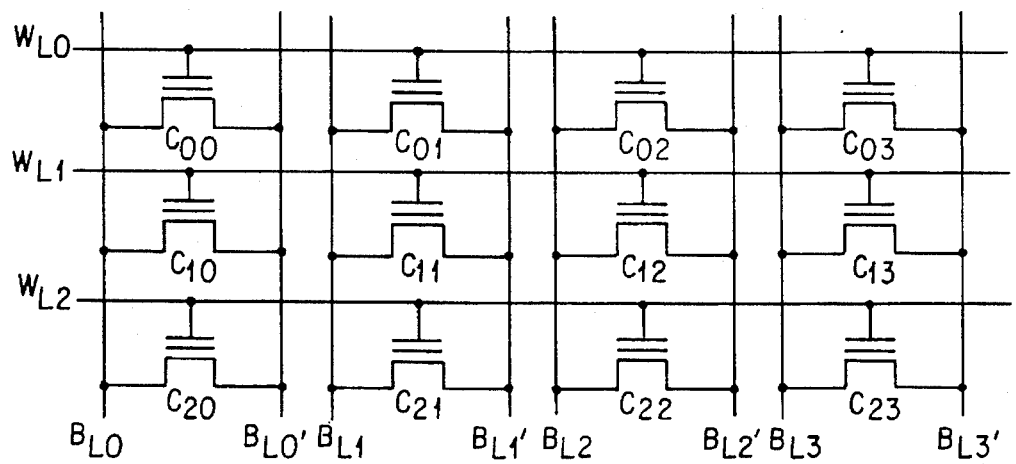

Cells in adjacent columns may or may not share source/drain regions. If each cell has its own source/drain regions, the schematic diagram of the array would be as illustrated in FIG. 3b. An example of a pair of cells built with individual source/drain regions is illustrated in FIG. 11. One of the advantages of the memory cells of the present invention is that they may be programmed with both positive and negative voltages. Table 1 illustrates the voltage levels applied to the bitlines ($BL_0$–$BL_4$) and word lines ($WL_0$–$WL_2$) of the array shown in FIG. 3a.

(bitline). Although they exhibit some problems, each of these first erasing or writing techniques can be utilized with the cell of the present invention.

An improved erase method is described in U.S. Pat. No. 4,742,492 ('492) issued May 3, 1988, incorporated herein by reference. In the '492 patent, a negative voltage –HV is applied to the control gate 30 and a zero voltage is applied to the source. Here, the voltage difference between control gate and source is still HV volts (i.e., 0–(–HV)=HV). This method provides an advantage that it allows using low voltage isolation within a memory array. This erase technique is shown on the second row of the erase examples in Table 1.

Several disadvantages, however, exist with the previous methods. In typical applications, the voltage V (or –V) is provided by a charge pump. In a typical cell, the voltage V will be about 17 to 18 volts. However, as known in the art, charge pumps tend to become less efficient when higher voltages are needed. A typical charge pump is built with stages. The higher the voltage required, the more stages will be needed. The later stages will be less efficient. Therefore, it is desirable to have an array which requires a lower voltage to be supplied by the charge pump.

TABLE 1

| MODE | | WL0 | WL1 | WL2 | BL0 | BL1 | BL2 | BL3 | BL4 |
|---|---|---|---|---|---|---|---|---|---|
| Write | 1 | 0V | +HV | 0V | 0V | 0V | 0V | 0V | 0V |
| C11 | 2 | 0V | 0V | 0V | 0V | 0V | –HV | 0V | 0V |
| | 3 | 0V | +MV | 0V | 0V | 0V | –MV | 0V | 0V |
| Flash | 1 | +HV | +HV | +HV | 0V | 0V | 0V | 0V | 0V |
| Write | 2 | 0V | 0V | 0V | –HV | –HV | –HV | –HV | –HV |
| | 3 | +MV | +MV | +MV | –MV | –MV | –MV | –MV | –MV |
| Read C11 | | –Vr | +Vr | –Vr | Float | 0V | Vs | Float | Float |
| Erase | 1 | 0V | 0V | 0V | 0V | 0V | +HV | 0V | 0V |
| C11 | 2 | 0V | –HV | 0V | 0V | 0V | 0V | 0V | 0V |
| | 3 | 0V | –MV | 0V | 0V | 0V | +MV | 0V | 0V |
| Flash | 1 | 0V | 0V | 0V | +HV | +HV | +HV | +HV | +HV |
| Erase | 2 | –HV | –HV | –HV | 0V | 0V | 0V | 0V | 0V |
| | 3 | –MV | –MV | –MV | +MV | +MV | +MV | +MV | +MV |

Note:
HV = High Voltage (For example, 18 V)
MV = Medium Voltage (For example, 9 V)
Vr = Word line read voltage (For example, 3 V)
Vs = Bit line sense voltage (For example, 1.2 V)

The capability of programming (i.e., writing and erasing) the array with both positive and negative voltage comes from the fact that each well 16 is junction (or oxide) isolated from the region 12 and therefore diffusions (i.e., source/drain regions) can be biased negatively without forward biasing the diffusion/substrate junction.

There are several advantages of the programming method of the present invention. In a standard flash EEPROM cell, the cell is erased by applying zero volts to the control gate 30 (e.g., the wordline) and a positive voltage HV to the source (e.g., the bitline). In other words, the voltage difference between the control gate and source is HV volts (i.e., HV–0=HV). An example of this technique is shown in the first erase example (either flash or cell C11) of Table 1. However, since more than one cell in each array share source/drain regions, the application of the positive voltage to a source region of one cell can adversely effect other cells in the array.

A similar technique is used to write to the cell as illustrated in the first write example of Table 1. In this case, a high voltage +HV is applied to the gate 30 of the cell(s) to be written to and a zero voltage applied to the source The '492 patent also teaches an erase technique where a negative voltage of –MV is applied to the control gate 30 (e.g., wordline) and a positive voltage +MV is applied to the source (e.g., bitline). In this case, the voltage MV is half the voltage HV. Therefore, once again, the voltage difference between control gate and source is still HV volts (i.e., +MV–(–MV)=HV). This method provides an advantage that the circuitry only needs to generate voltage levels which are half as high as previously required. This can be a great advantage, for example, if charge pumps are being used to generate the programming voltages.

Figure 4:
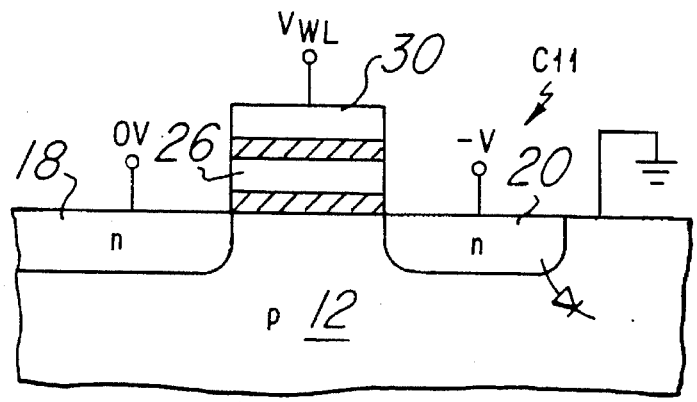
FIG. 4 is a cross-section of a prior art cell to illustrate how the writing method of the present invention would be inoperative.

The techniques taught in the '492 patent, however, cannot be extended to writing to a cell. FIG. 4 illustrates a prior art cell. In a typical application, the substrate 12 is grounded. If a voltage which is less than the substrate voltage is applied to the source/drain 20, the source/drain-substrate junction will be forward biased and current would flow into the substrate 12 rather than towards the channel 22 as desired.

In the present invention, on the other hand, the source/drain is isolated from the substrate by the intervening layers 14 and 16 of semiconductor. Since the potential of each of these regions can be controlled (via contact) the undesired diode effect can be eliminated.

The second and third lines within the write examples of Table 1 illustrate this writing technique. In the second example zero volts are applied to the gate 30 while a negative voltage −HV is applied to the source/drain 20. In the third example, the positive voltage +MV is applied to the gate 30 while the negative voltage −MV is applied to source/drain 20. The magnitudes of the voltages −MV and +MV may be equal but do not have to be. In other words, the voltages can be any value so long as the difference between the two is HV volts.

Figure 5A:
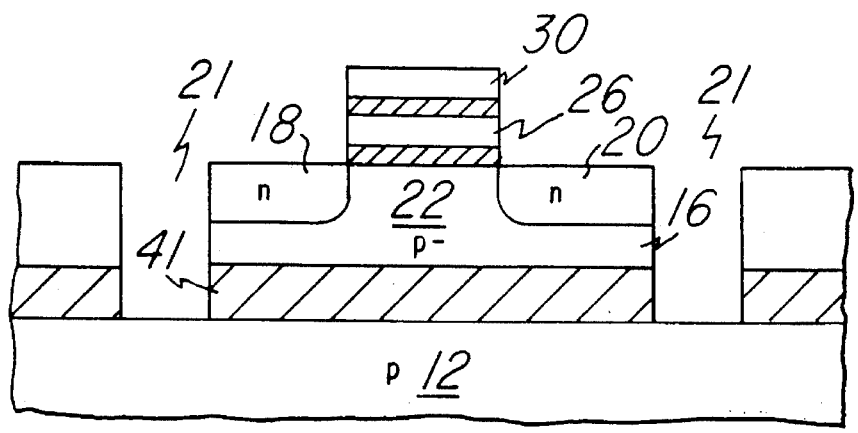
FIGS. 5a and 5b are cross-sections of alternate embodiment floating gate transistors.
Figure 5B:
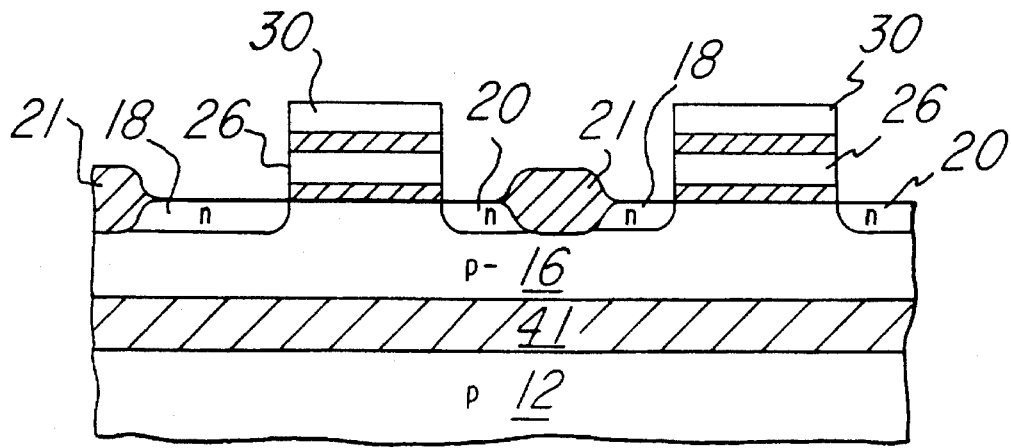

FIGS. 5a and 5b illustrate an alternate cell which can be programmed using any of the methods of the present invention. Referring to FIG. 5a, an insulating layer 41 is formed on the surface of semiconductor region 12. The region 12 can be any of the regions previously described. The insulating layer 41 may comprise an oxide, a nitride or a sapphire layer.

In the embodiment of FIG. 5a, the memory cells are formed in semiconductor region 16. In an SOI (silicon on insulator) embodiment, the semiconductor region 16 may comprise a mesa. As described before, one, some or all the cells may be formed in a single mesa. The mesas are isolated from one another by trench 21 which may be filled with an insulating material.

An alternate embodiment is illustrated in FIG. 5b. In this embodiment, adjacent cells are separated by field insulating regions 21 rather than trenches. Other isolation methods can also be used.

The insulating layer 41 may be formed over the entire chip or alternatively may be formed only where needed for the non-volatile memory array. The semiconductor region 16 may be formed by epitaxially depositing a semiconductor layer such as single crystal silicon. Alternatively, polycrystalline silicon can be used as well as other semiconductors such as germanium or gallium arsenide.

It should also be noted that the semiconductor region 14 may comprise a semiconductor layer (e.g., an epitaxially grown layer) while the semiconductor region 16 comprises a well region formed within the layer 14.

In one embodiment of the present invention, the array is coupled to a level shifter with the capability of selecting both positive and negative voltages. One such level shifter will be described next. A circuit which utilizes this level shifter in an EEPROM array will then be described. A level shifter circuit for integrated circuits is also discussed in U.S. Pat. No. 5,157,281 issued Oct. 21, 1992, incorporated herein by reference.

MOS technology allows the generation of negative voltage with respect to circuit ground using a voltage multiplying technique. In the conventional CMOS process, the charge pump circuit uses only p-channel devices due to the necessity to insulate the generated negative voltage from the substrate, which is tied to the circuit ground. Also, no n-channel transistors can be used in the negative voltage path since the N+/P− junction between transistor source or drain and IC substrate would be biased in direct conduction thus shorting the negative voltage to $V_{SS}$. This fact limits negative voltage charge pump application only where a bulk type of negative biasing is needed.

Some circuits have been developed in order to switch a negative voltage, such as a memory row decoder, for example, but their implementation is cumbersome or very difficult to be realized in practice. Some examples include: p-channel depletion transistors, circuits with one negative charge pump for each cell that needs to be independently selected, silicon on insulator circuits, and p-channel only circuitry which requires a more negative voltage to control the switching.

The present invention details a method of building devices with well (or tank or tub) regions. In one example, the wells are left with n type impurities.

Availability of deep n well process used for implementing high power MOS transistors, makes it possible now to design a new type of CMOS inverter-level shifter, able to work and select voltages both higher than $V_{SS}$ and lower than $V_{SS}$. A cross sectional diagram of a preferred embodiment CMOS shifter 40 is illustrated in FIG. 6.

Figure 6:
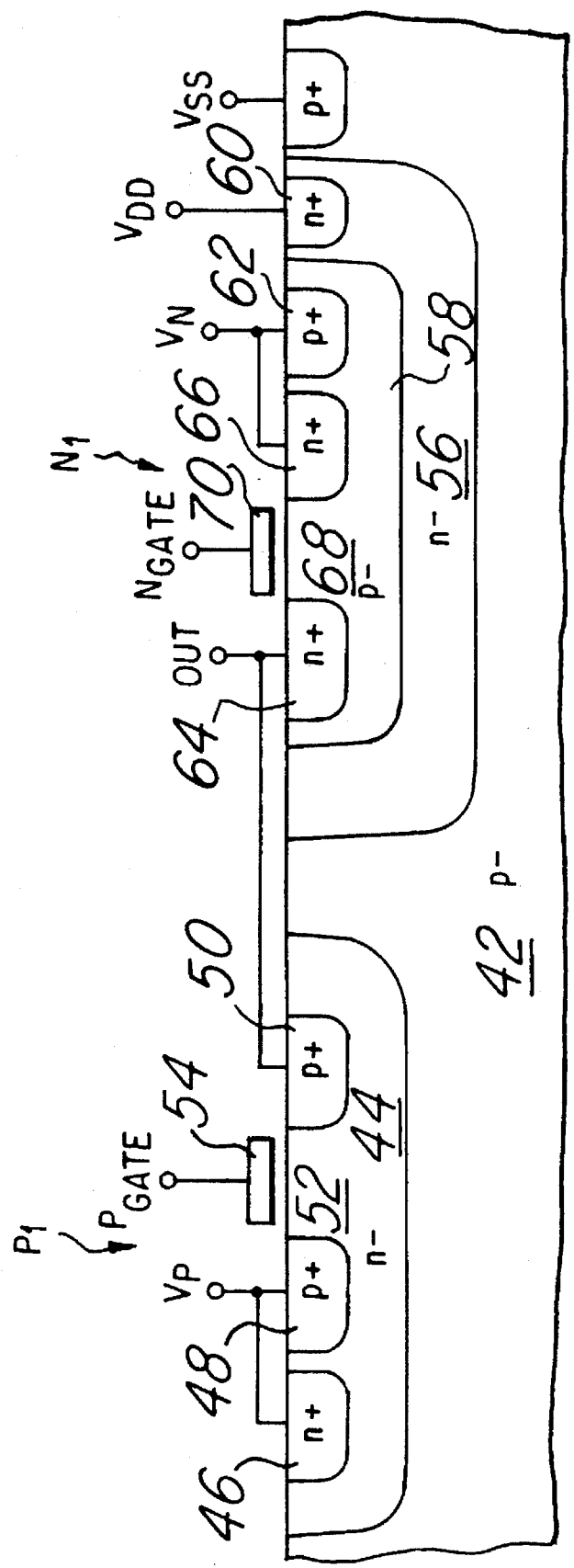
FIG. 6 is a cross-section of a level shifter circuit.

Referring now to FIG. 6, a semiconductor region 42 is provided. If the level shifter 40 is used in conjunction with an EEPROM cell 10 (as shown in FIG. 1 or 2), the region 42 will be the same as the region 12. Accordingly, semiconductor region 42 has the same characteristics and alternatives as described previously with respect to semiconductor region 12.

The following discussion assumes that the semiconductor region 42 is doped with p-type impurities. However, this is not a requirement. If an n-type region is available, each of the conductivity types would be reversed.

A first well region 44 is formed within semiconductor region 42. The first well region 44 is doped with n-type impurities. A body contact region 46 of more highly doped semiconductor material may be included in well 44 to facilitate electrical contact to the well region 44.

First and second p-channel source/drain regions 48 and 50 are also formed in well region 44. The source/drain regions 48 and 50 are separated by a channel region 52. Gate 54 overlies channel region 52 and is insulated therefrom. The source/drain regions 48 and 50 along with channel 52 and gate 54 form p-channel transistor $P_1$.

Second n-well region 56 is also formed in semiconductor region 42 and is spaced from the first n-well 44. P-well 58 is formed within the second n-well 56. An n-well contact region 60 may also be formed with n-well 56 and a p-well contact region 62 may be formed in p-well 58.

First and second n-channel source/drain regions 64 and 66 are formed in p-well 58. The source/drain regions 64 and 66 are separated by a channel region 68. A gate 70 overlies the channel region 68 and is insulated therefrom. The source/drain regions 64 and 66 along with channel 68 and gate 70 from n-channel transistor $N_1$.

With this configuration, the p-well 58 in which the n-channel device $N_1$ is built, is insulated from the substrate 42 by the deep n-well 56. The n-well 56 may be coupled to voltage node $V_{DD}$. The voltage Vn can be coupled to source/drain region 66 and also contact region 62. The voltage Vn can be lower than $V_{SS}$, thus making possible the selection of a negative voltage. The voltage Vn may be provided by a charge pump (not shown). From the p-channel side, the n-well region 44 can be raised higher than $V_{DD}$, thus making possible to select positive voltages higher than $V_{DD}$.

If the signals driving gate 54 and gate 70 are at CMOS levels, typically between $V_{SS}$ and VDD, some form of feedback is needed to be able to turn off the p-channel or the n-channel devices. The final form of the circuit may be as shown in FIG. 7.

Figure 7:
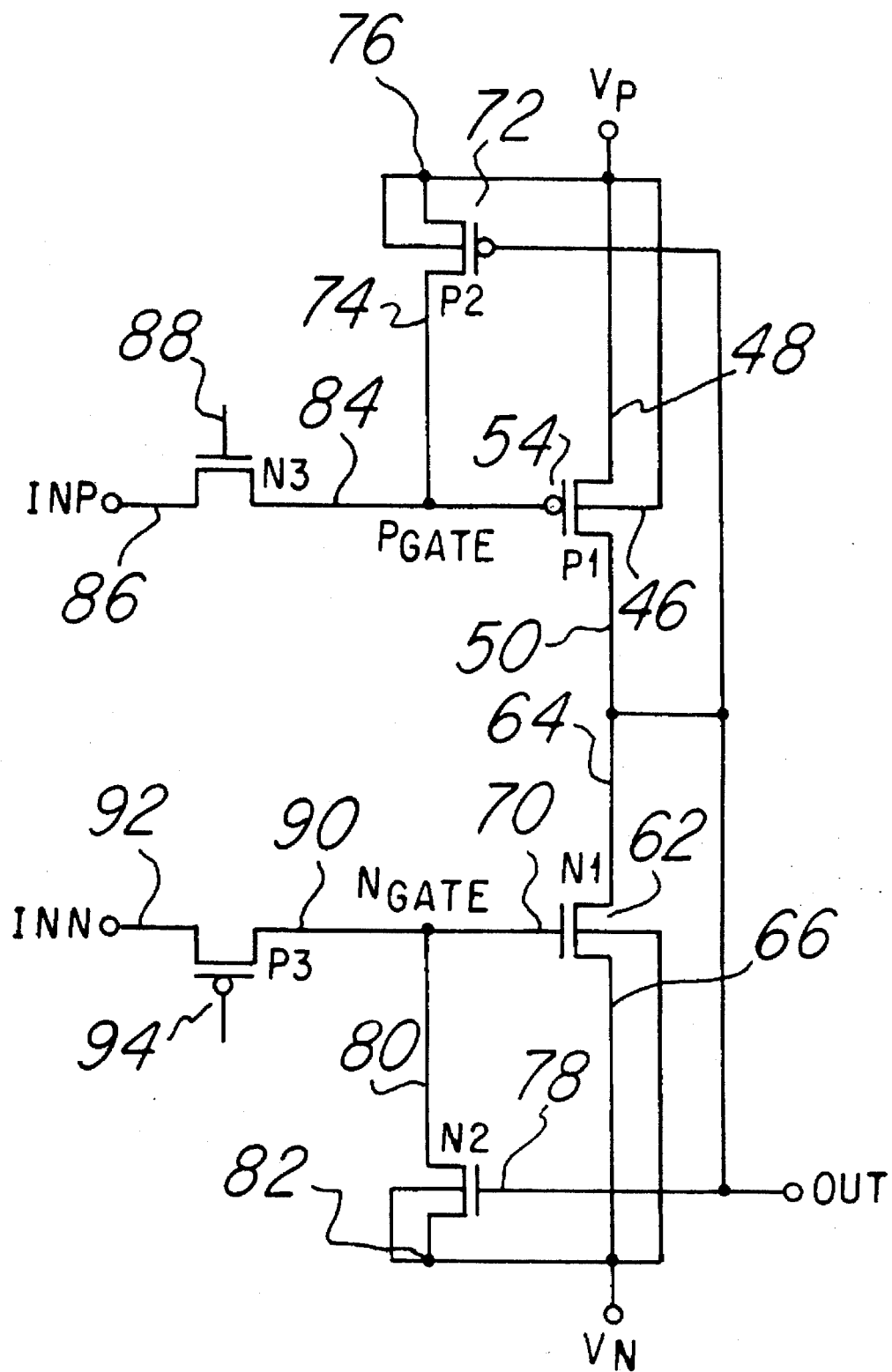
FIG. 7 is a schematic diagram of a level shifter circuit.

Referring now to FIG. 7, p-channel transistor $P_1$ and n-channel transistor $N_1$ are provided as described with respect to FIG. 6. Also provided are p-channel feedback transistor $P_2$ and n-channel feedback transistor $N_2$.

The gate 72 of the p-channel feedback transistor $P_2$ is coupled to the output node OUT. The source 74 of the transistor $P_2$ is coupled to the gate 54 of transistor $P_1$ at node $P_{GATE}$, and the drain 76 is coupled to the voltage node $V_P$. The transistor substrate (which preferably comprises an n-doped well, possibly n-well 44) is also coupled to the voltage node $V_P$.

Similarly, the gate 78 of the n-channel feedback transistor $N_2$ is coupled to the output node OUT. The source 80 is coupled to the gate 70 of the transistor $N_1$ at node $N_{GATE}$ and the drain 82 is coupled to the voltage node $V_N$. The transistor substrate (which may comprise a p-doped well formed in an n-doped well, possibly p-well 58) is also coupled to the voltage node $V_N$.

Access transistors $N_3$ and $P_3$ are also illustrated in FIG. 7. The drain 84 of access transistor $N_3$ is coupled to the node $P_{GATE}$ while the source 86 is coupled to p-side input INP. The gate 88 is coupled to a voltage node such as voltage node $V_{DD}$. Likewise, the drain 90 of access transistor $P_3$ is coupled to the node $N_{GATE}$ while the source 92 is coupled to n-side input INN. The gate 94 is coupled to a voltage node such as voltage node $V_{SS}$.

The operation of the circuit will now be explained.

When voltage $V_P$ is equal to voltage $V_{DD}$ and voltage $V_N$ is equal to $V_{SS}$, this circuit acts like a CMOS inverter. When INP and INN are at $V_{DD}$, $P_1$ is off, $N_1$ is on and the output is $V_{SS}$. The feedback transistor $P_2$ will restore the full $V_{DD}$ voltage level on node $P_{GATE}$.

Likewise, when INP and INN are at voltage level $V_{SS}$, $P_1$ is on and $N_1$ is off so the output node OUT is at voltage level $V_{DD}$. The feedback transistor $N_2$ will restore full $V_{SS}$ voltage level on node $N_{GATE}$ to ensure that transistor $N_1$ is off.

If a voltage higher than $V_{DD}$ needs to be selected on node OUT, $V_{SS}$ level is applied to nodes INP and INN so that OUT will go to the $V_{DD}$ voltage level as explained above. When the switching is complete, the voltage $V_P$ is raised over $V_{DD}$ and as a result, the node OUT will follow $V_P$. In this manner, the node OUT will be greater than the level $V_{DD}$. If a voltage lower than $V_{SS}$ needs to be selected to OUT, $V_{DD}$ will be applied to INP and INN. When the switching is completed and OUT is at $V_{SS}$, $V_N$ can be lowered from $V_{SS}$ and OUT will follow.

When a voltage higher than $V_{DD}$ or lower than $V_{SS}$ needs to be deselected, operations are explained with reference to FIG. 8. Circuits A and B are each circuits as described in FIG. 7.

The operation of the circuit if FIG. 8 will now be described.

If a voltage higher than $V_{DD}$ needs to be selected on OUTA and deselected from OUTB, INPA and INNA are tied to $V_{SS}$ and the circuit A behaves as explained in the previous section. INPB and INNB are tied to $V_{DD}$ and circuit B will behave as follows: Referring to FIG. 7, if $V_N$ is equal to $V_{SS}$, then N1 will turn on so that OUTB will go to $V_{SS}$. Feedback $P_2$ turns on and raises the node $P_{GATE}$ to voltage level $V_P$ thus turning $P_1$ off so that the charge pump driving $V_P$ will not be loaded by AC current. Transistor $N_3$ will turn off so $V_P$ will be insulated from the circuit driving INPB and INNB.

On the other hand, if a voltage lower than $V_{SS}$ needs to be selected on OUTA and deselected on OUTB, INPA and INNA are tied to $V_{DD}$ and the circuit A behaves as explained on the previous section. INPB and INNB are tied to $V_{SS}$ and circuit B will behave as follows: Referring to FIG. 7, if $V_P$ is equal to $V_{DD}$, then $P_1$ turns on so that OUTB will go to $V_{DD}$. Feedback transistor $N_2$ turns on and $N_{GATE}$ is lowered to $V_N$ that $N_1$ is turned off and the charge pump driving $V_N$ is not loaded by AC current. Access transistor $P_3$ will turn off so $V_N$ will be insulated from the circuit driving INPB or INNB.

The case in which $V_P$ is greater than $V_{DD}$ and $V_N$ is less than $V_{SS}$ at the same time is an extension of the two previous cases.

In conclusion, a circuit able to select and deselect voltages higher than $V_{DD}$ and lower than $V_{SS}$ in a CMOS integrated circuit which substrate is biased to $V_{SS}$ and power supply is $V_{DD}$, has been invented.

The novel circuit can be applied to EEPROM memories. A desirable feature of an EEPROM memory is the ability to alter the status of any single bit from erased to programmed without disturbing the status of the remaining bits in the memory array. But this ability is paid for by a cell size about five times larger than the size of an EPROM cell.

A flash EEPROM is a memory which has a cell size only slightly larger than EPROM and uses the same electrical approach to change status of a single bit. That is, electrons tunnel through a very thin layer of insulating material. For example, this so-called gate oxide may comprise 100 Å of silicon dioxide. But the problem of Flash EEPROM approach is that the memory bits can only be singularly programmed and the erase is a bulk operation. That is, all the bits of the memory are erased at the same time.

This problem is tied to the fact that to erase a bit, a negative voltage is used on the gate side while a positive voltage is applied to the source. This configuration forces the electrons stored on the floating gate to tunnel back and leave a positive charge that is the erase status of the cell. It is the inability to select a negative voltage on a conventional CMOS integrated circuit that creates a root problem.

A possible partial solution of the problem has been to divide the memory array in sections singularly erasable using one a negative charge pump for each sector. However, this architecture becomes impractical if a high grade of operability is desired.

Figure 8:
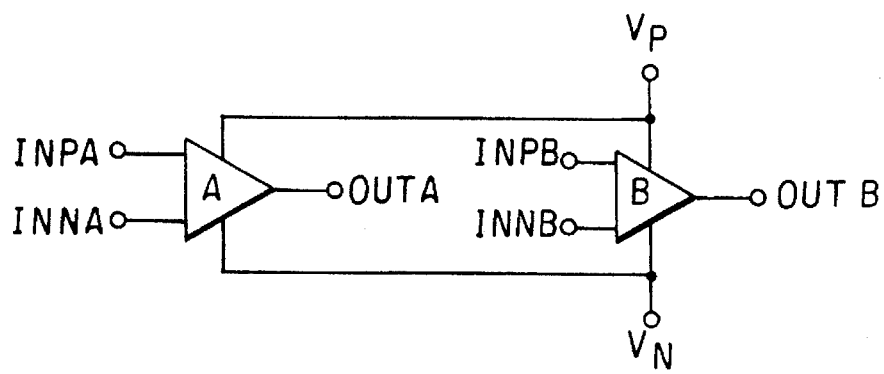
FIG. 8 is a block diagram using the circuit of FIG. 7 for selecting and deselecting voltages higher than the supply voltage or lower than the reference voltage.

Using the CMOS level shifter with the capability of selecting both positive and negative voltage, the invention of which is described with respect to FIGS. 7 and 8, a novel approach to realize an EEPROM memory is possible.

Figure 9:
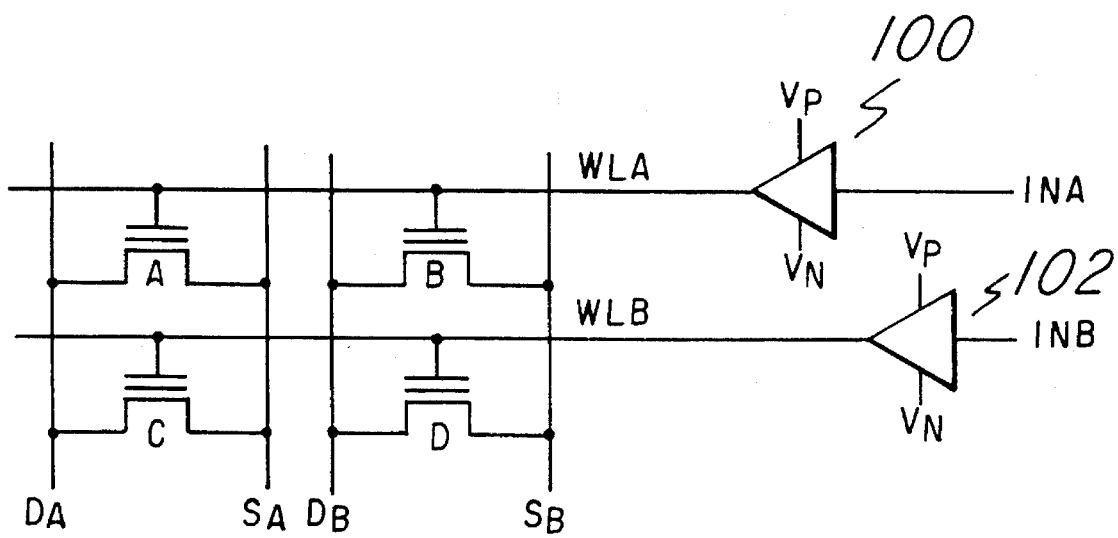
FIG. 9 is a schematic of an array which utilizes a level shifter circuit.

A first method will be described with reference to FIG. 9 along with Table 2. FIG. 9 illustrates an exemplary four cell array of flash EEPROM cells arranged in two rows and two columns. A first level shifter 100 has an output WLA coupled to the wordline of the first row. In other words, the output WLA is coupled to the gates of the EEPROM cells A and B. Similarly, second level shifter 102 has an output WLB coupled to the wordline of the second row which includes cells B and C. The level shifters 100 and 102 are preferably formed as described above with reference to FIGS. 6 and 7.

Table 2 provides an example of voltages used to program and erase the cell A in the 4-cell array shown in FIG. 9.

TABLE 2

|  | WLA | WLB | DA | DB | SA | SB | VP | VN | INA | INB | Deep N-well |
|---|---|---|---|---|---|---|---|---|---|---|---|
| Program A | −18V | +7V | Flt | Flt | 0V | +7V | +18V | +7V | 0V | 5V | +7V |
| Erase A | −10 V | +5V | Flt | Flt | 5V | +0V | +5V | −10V | 5V | 0V |  |

If cell A has to be erased, a voltage of −10V on the gate and +5V on the source will create an electric field over the tunnel region. The intensity of this electric field is enough to tunnel back to the source all the electrons present on the floating gate.

To appreciate the value of this aspect of the present invention, the state of the other three cells (B, C and D) comprising the array must be examined. Regarding cell B, if cell A is erased, the status of cell B will not change with −10V on the gate and 0V on the source. If cell A is programmed, the negative voltage on the floating gate will follow to the voltage on the gate so some extent of erase disturb can be expected. That is, its threshold voltage can be reduced. Regarding cell C, the gate voltage will be 5V and source voltage will be 5V so no electric field can exist over the tunnel region and so its status will not be changed. Regarding cell D, the gate voltage will be 5V and source will be 0V. In this case, the electric field over the tunnel region is well below the threshold of 7 Meg V/cm needed to start any electrons tunneling, so no change of this cell status is expected.

In conclusion, this demonstrates that, a novel approach to EEPROM using Flash EEPROM cell structure is possible.

A second and more conservative approach is also possible in the case that the erase disturb of the first method is an undesirable feature. This second approach still makes use of the novel capability to select a negative voltage.

Figure 10:
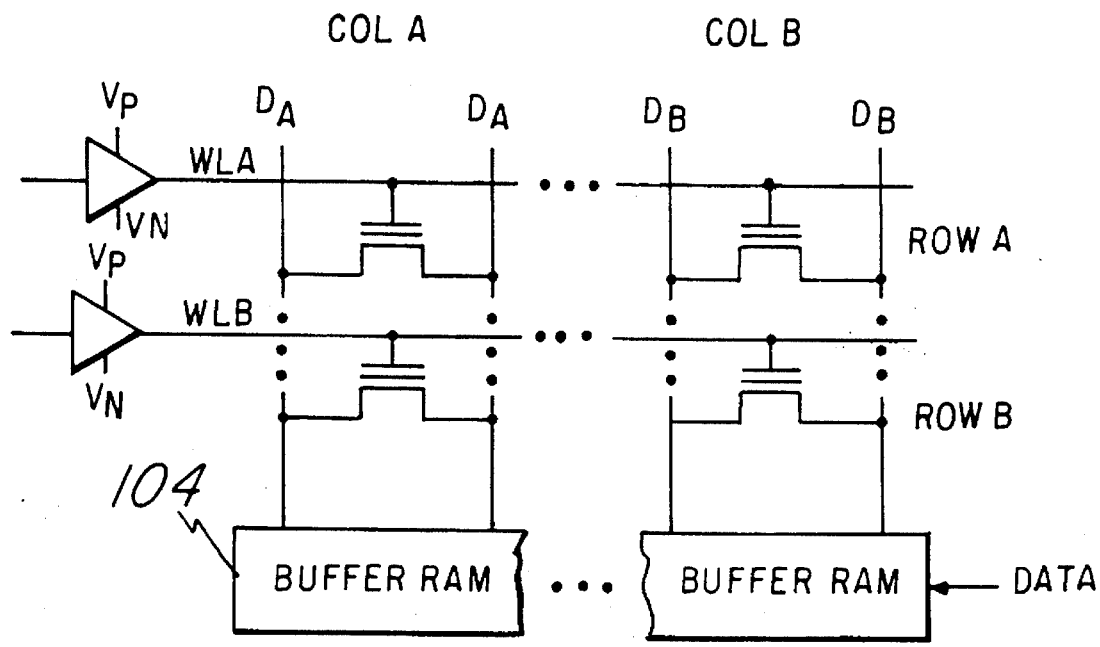
FIG. 10 is a schematic of an alternate embodiment array which utilizes a level shifter circuit.

FIG. 10 is an example of a memory array using the second method. Buffer RAM 104 is typically a static RAM cell interfacing with the columns of the array. The function of buffer RAM 104 is to store the data to be written in a row when using the page mode programming. This scheme provides a standard method to write in EEPROM and Flash EEPROM memories.

If cell A only needs to be reprogrammed, the first step will be to read row A and store its content in to the buffer RAM 104.

The second step will be to erase the whole row A by selecting a negative voltage on wordline WLA, while the deselected wordline WLB goes to 5V. All sources lines are tied to 5V as described with the first method, cell A and B are erased while cells C and D, having both gate and source at the same potential of 5V, are not disturbed.

On the third step, the data to be written in cell A is stored in the buffer RAM 104 connected to the column A, while the remaining cells content is unchanged. The fourth step is to write into row A the contents of the buffer RAM 104. At the end, the result is that only the content of cell A has been modified while all the remaining cells of row A and B have their contents unchanged.

This method demonstrates that using the technique of selecting and deselecting negative voltage, a novel architecture to fabricate EEPROM memories with the same small cell size of a Flash EEPROM memory, has been invented.

Figure 12:
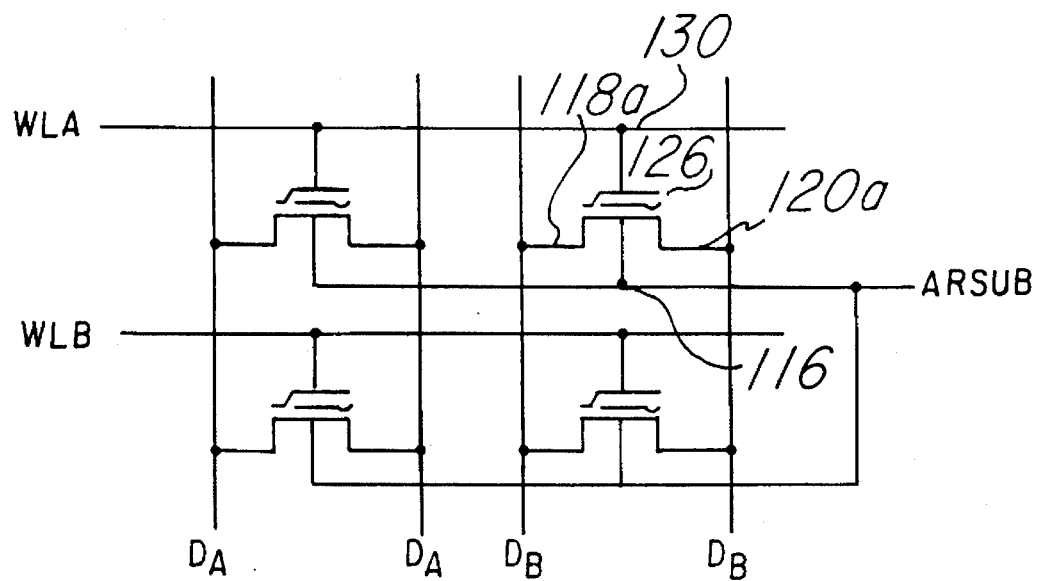
FIG. 12 is a schematic of an array of cells such as the one illustrated in FIG. 11.

Referring now to FIGS. 11 and 12, flash EEPROM array with a separate p-well, insulated from the substrate by a deep n-well, is illustrated.

Referring now to FIG. 11, a structure which includes two flash EEPROM cells 10a and 10b formed in a p-well 16 is illustrated. P-well 16 is formed in n-well 14 which in turn is formed in semiconductor region 12. As discussed regarding semiconductor region 12 shown in FIG. 1, the region 12 may be one of many types of semiconductor regions.

Each of the memory devices 10 comprise a source region 18 and a drain region 20. The source/drain regions are formed beneath an insulating region and therefore are sometimes referred to as buried regions. The source/drain regions 18 and 20 are separated by a channel region 22. Formed above a portion of channel region 22 is floating gate 26. Unlike the floating gate structure illustrated in FIGS. 1 and 2, the floating gate 26 of this embodiment extends over only a portion of the channel 22. A control gate (or wordline) 30 is formed over both transistor floating gates 26 and channel regions 22.

Also illustrated in FIG. 11 are field insulating regions 21. The regions 21 are provided to electrically isolate portions of the device. Typically, the field insulating regions 21 comprise an oxide such as thermally grown silicon dioxide.

In addition, each well region may include a more heavily doped contact region. Accordingly, contact region 13 comprises more heavily doped p-type material and is formed in semiconductor region 12. Also, more heavily doped n-type contact region 15 is formed in n-well 14 and more heavily doped p-type contact region 17 is formed in p-well 16.

FIG. 12 illustrates a four cell array formed with two rows and two columns. The exemplary cell A has been labeled to correspond with the structure of FIG. 11.

Table 3 provides an example of specific voltage levels which may be applied to the array of FIG. 12 in order to operate the array. Of course, other values may be used for other specific embodiments.

TABLE 3

|  | WLA | WLB | AA | SA | DB | SB | ARSUB | DEPN+ |
|---|---|---|---|---|---|---|---|---|
| Read A | 3.5V | 0V | 0V | Fl | 0V | 1.5V | 0 | 5V |
| Write A | 10V | 0V | Fl | 0V | Fl | −8V | −8V | 5V |
| Erase A | −10V | 5V | Fl | 0V | Fl | 5V | 0V | 5V |

This embodiment provides a number of advantages. First, the p-well 16 and also the source SB (20) can be charge pumped to −8V. In this way, in order to have 18V of voltage drop over the cell (a typical programming voltage for a flash EEPROM cell), a maximum voltage of only 10V must be generated for the word line. This will greatly alleviate the demand for a high voltage process.

A second advantage of having an insulated p-well 16 for the array is to permit the deselection of an erased one transistor cell. In fact, if the pass gate is omitted from the cell, an eventual over erase results in a depletion status. This phenomena causes the impossibility to deselect the cell using 0V on the deselected word line. But, if the substrate is pumped slightly negative, this will add to the cell threshold voltage, and so the positive dosage present on the floating gate will be no longer able to keep this cell conducting. The conditions for reading the cell are shown in Table 4.

(not shown) is formed over the regions which will not be doped. (Noting it is not typically necessary to form a mask over the field insulating regions 21 although it will not hurt). Source/drain regions 18, 19 and 20 and well contact region 15 are formed in this doping step. As will be discussed in more detail below, other devices may be simultaneously formed. Once again, the doping step preferably comprises an implantation step.

Figure 13A:
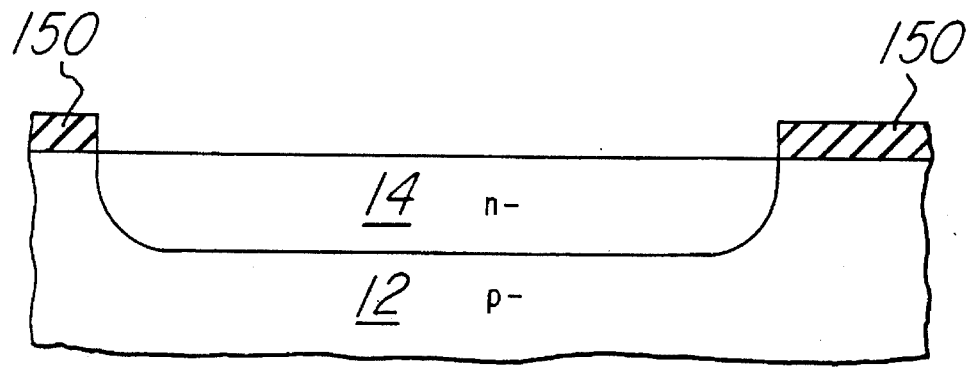
FIGS. 13a–13f are cross-sections of a floating gate transistor at various stages in the fabrication process.
Figure 13B:
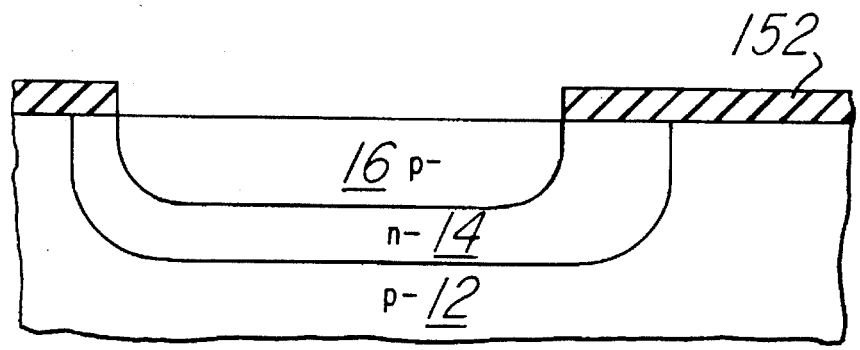
Figure 13C:
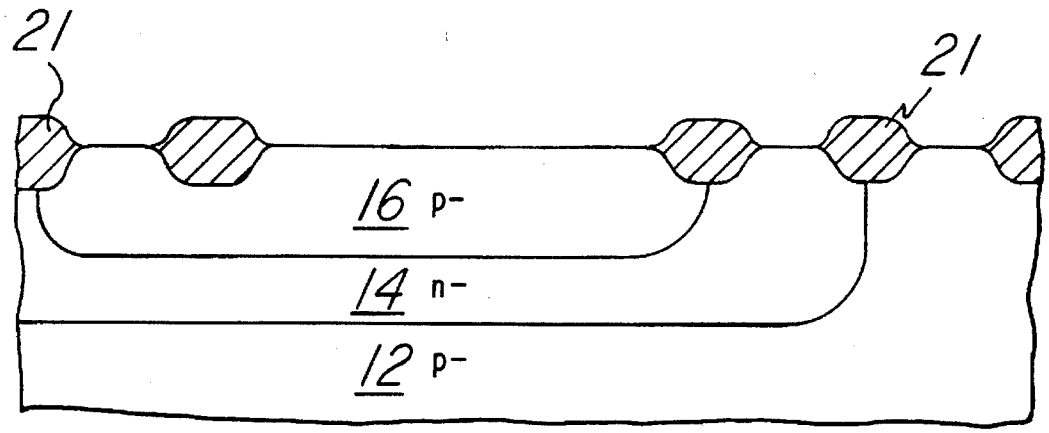
Figure 13D:
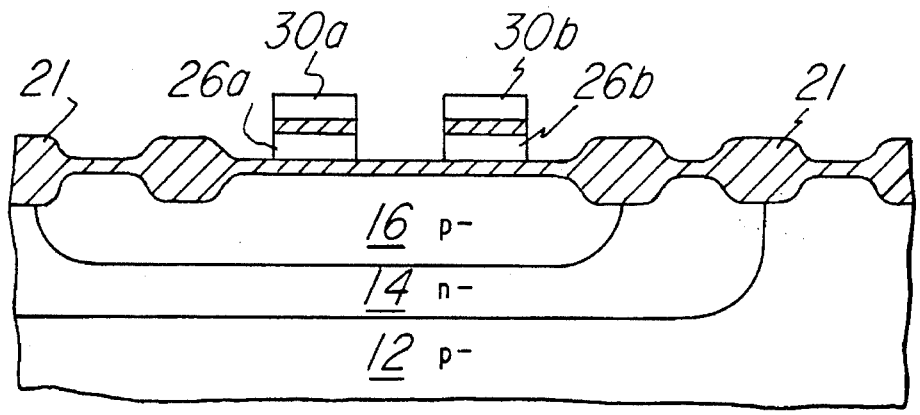
Figure 13E:
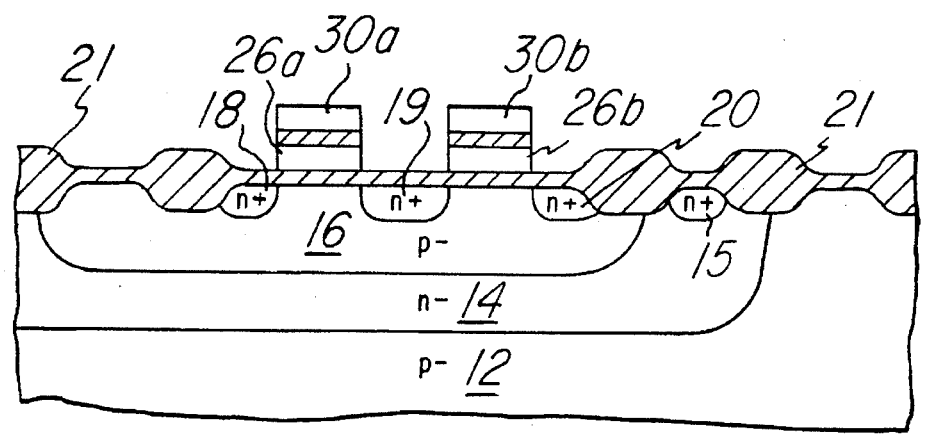
Figure 13F:
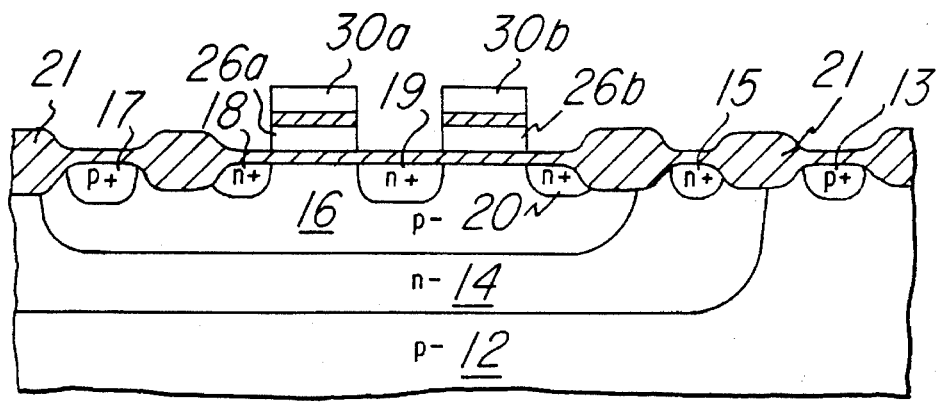

Referring now to FIG. 13*f*, the more highly doped p-regions are formed. In this case, the p-well contact region 17 and substrate contact region 13 are formed. It should be noted that the fact that the n regions were formed before the p regions is a matter of totally arbitrary choice. Accordingly,

TABLE 4

|        | WLA | WLB | AA | SA | DB | SB   | ARSUB | DEPN+    |
|--------|-----|-----|----|----|----|------|-------|----------|
| Read A | 3V  | 0V  | 0V | Fl | 0V | 1.5V | -3V   | $V_{DD}$ |

An exemplary fabrication process flow will now be described with respect to FIGS. 13*a*–13*f*. It should be noted that variations to the process flow of FIGS. 13*a*–13*f* can be included.

Referring now to FIG. 13*a*, semiconductor region 12 is provided as previously described. A masking layer 150 is formed on the surface of semiconductor region 12 and is patterned using an of a large number of lithography techniques. A first well region 14 is then formed within region 12. Preferably the well 14 is implanted but other doping techniques such as diffusion can also be used. Arsenic and/or phosphorus are the typical n-type dopants but other dopants may be used as well.

Referring next to FIG. 13*b*, the mask layer 150 is removed and mask 152 is formed. The second well 16 is formed within the region exposed by mask 152. As illustrated in FIG. 13*b*, the well 16 is formed within well 14. Boron is the typical p-type dopant but other dopants may be used as well.

In an alternate embodiment, both well regions 14 and 16 can be formed with a single mask as disclosed in U.S. Pat. No. 5,242,811 issued Sep. 7, 1993, incorporated herein by reference. In this embodiment, the dopants of well region 14 are chosen so that they have a greater diffusity than the dopants of well region 16. Because of this characteristic, when the device is heated, the region 14 dopants will diffuse farther and region 16 will be formed within region 14.

Referring now to FIG. 13*c*, field isolating regions 21 are formed. The field isolating regions 21 may be formed using a LOCOS (local oxidation of silicon) and therefore comprise a thermal oxide such as silicon dioxide. Other methods may also be used.

The next step is to form the gate structures of the EEPROM device. In a typical embodiment, a blanket layer of polysilicon is formed over the device. Next, an interlevel dielectric (e.g., oxide, nitride or combination thereof) is formed followed by a second layer of doped polysilicon. The polysilicon may be doped in situ or doped subsequent to deposition. The conductive and dielectric layers are then etched to form the gate structure which includes floating gate 26 and control gate 30. These gate structures are illustrated in FIG. 13*d*. Other materials could be used for the gate (e.g., aluminum or another metal).

Referring now to FIG. 13*e*, the more highly doped n-regions are formed. In the preferred embodiment, a mask layer the p regions 13 and 17 may have been performed before n-regions 15, 18, 19 and 20.

It should also be noted that a device which includes separate source/drain regions (that is, rather than a shared source/drain region 20) may be formed with minor variation. Also, buried source/drain regions as illustrated in FIG. 9 could also be formed by including buried isolation regions which could be formed before the highly doped regions are formed.

The present invention may be used in a variety of applications. Some specific examples include disk replacement applications, a boot up memory for microprocessors or microcontrollers, and data storage units.

Figure 14:
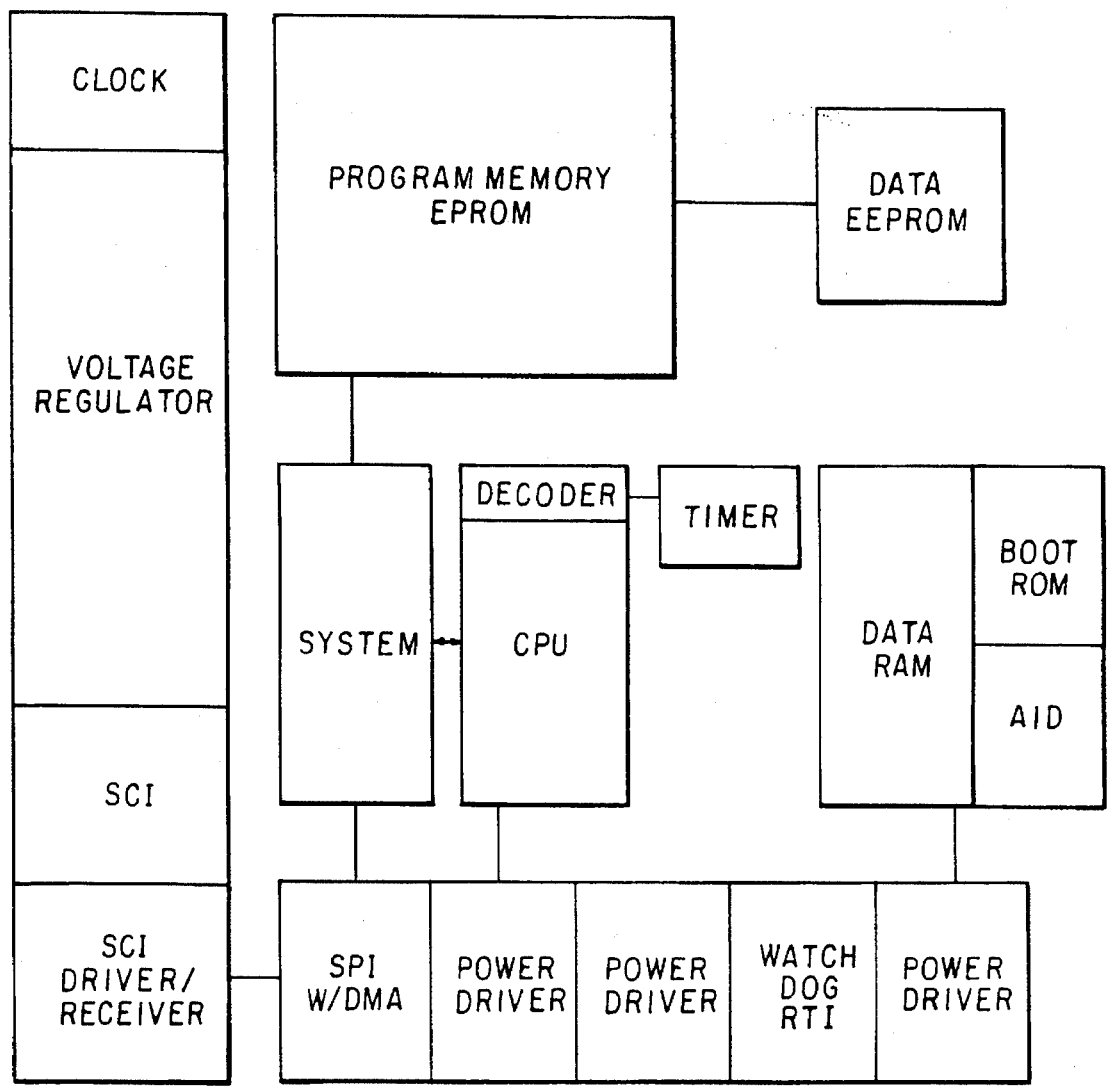
FIG. 14 is a block diagram of single chip circuit which utilizes a number of simultaneously formed devices.

In particular, the present invention is suited for a modular process flow such as is described in U.S. Pat. No. 5,242,811, incorporated herein by reference. This process strategy is sometimes referred to as PRISM. A block diagram of one exemplary PRISM circuit is illustrated in FIG. 14. As shown, the circuit may include some or all of phase lock loops, oscillators, EPROMs, voltage regulators, SCI (serial communication interface), SPI (serial peripheral interface), central processing units, random access memories, real only memories, decoders, direct memory access controllers, and gage drivers as well as EEPROMs as described herein.

Among the advantages provided, with an integrated process flow, that is where particular devices may be omitted if not required, some of the process steps may be omitted. For example, if the particular chip to be fabricated does not require power transistors having buffed drain regions or collectors, then a (n+) buried layer step, an EPI step, and a deep (n+) step may be omitted. Similarly, if the device does not require FAMOS EPROM cells, a FAMOS floating gate step and a EPROM stack step may be omitted. Additions to the process can be made as well for modifications of cells.

In addition to the modular nature of the process, process steps typically at the end of the process flow can be performed at the beginning of the process flow. An advantage of this is that key parameters of the invention, such as channel length, are defined by the diffusion rate of the dopants and not by the placement of the well with respect to a specific structure.

The inventive process provides a unified set of process parameters that can be applied to distinctly different devices. This allows design rules for the different devices to be stored in a library. An integrated circuit designer may select different devices from this library with the assurance that a process is available for building them, and that the devices so selected are compatible with this process. This considerably reduces design time for chips having new designs.

FIGS. 14a–14d and 15a–15d illustrate but two pairs of the number of devices which may be simultaneously formed using the PRISM process. In FIGS. 14a–14d, a vertical bipolar transistor is formed simultaneously with an EEPROM device. In FIGS. 15a–15d, a drain extended transistor is formed simultaneously with an EEPROM device. As will be clear, the vertical bipolar transistor, the drain extended transistor and the EEPROM could all have been formed simultaneously. In addition, other devices such as double diffused MOS (DMOS) transistor and lateral bipolar transistors as well as more standard MOS (n-channel, p+channel and CMOS) can also be simultaneously formed.

Figure 15A:
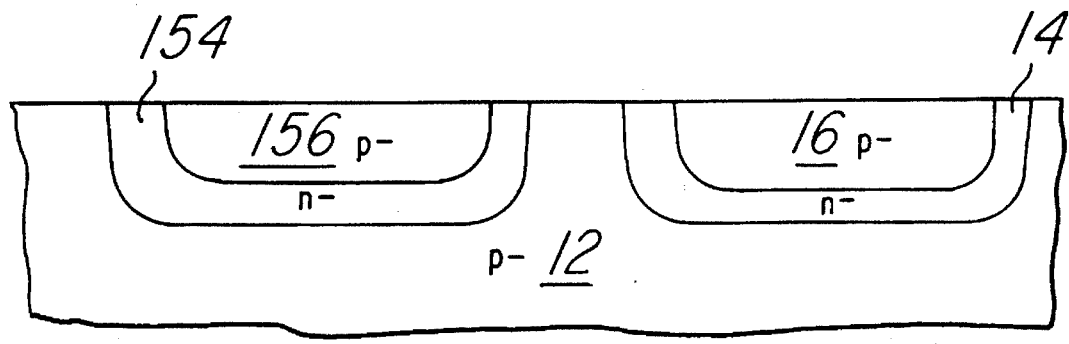
FIGS. 15a–15d are cross-sections of a simultaneously formed floating gate transistor and vertical bipolar transistor at various stages in the fabrication process.
Figure 15B:
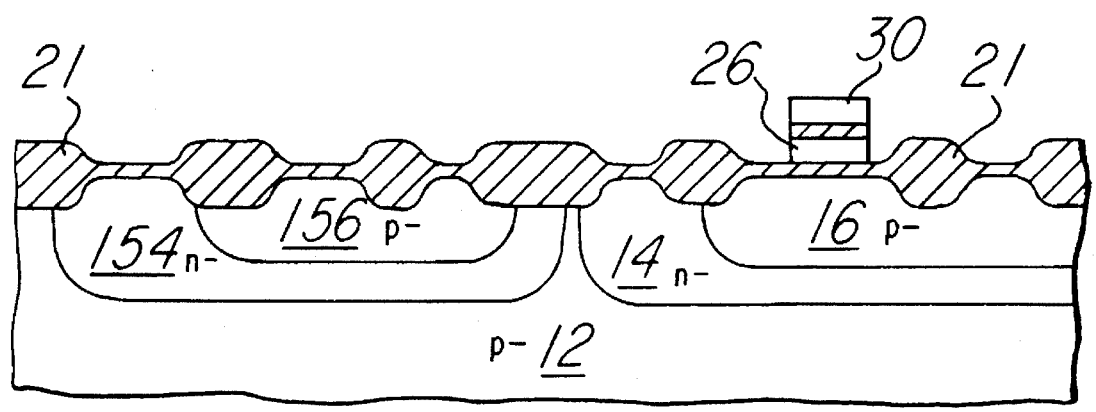
Figure 15C:
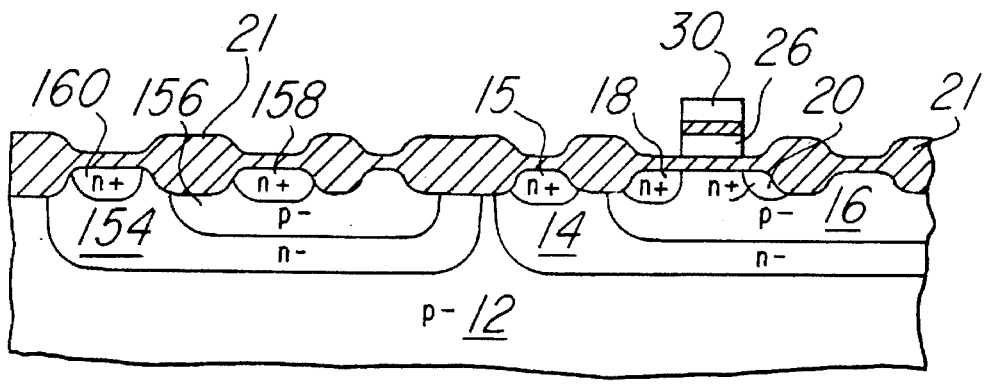
Figure 15D:
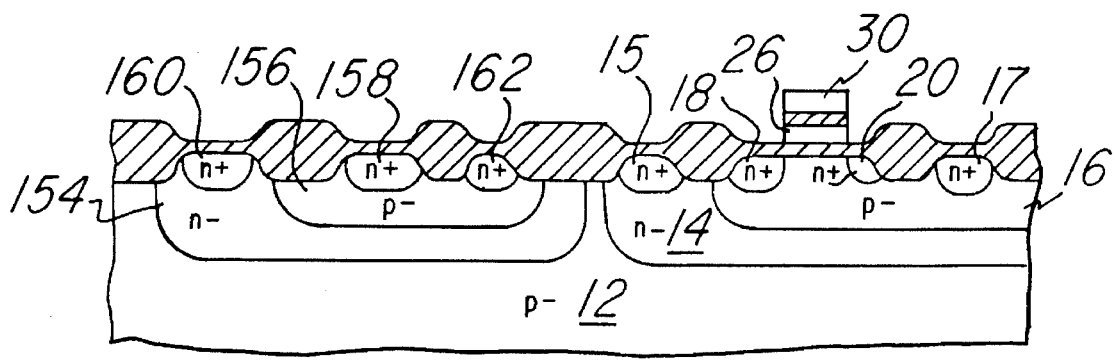

Referring first to FIG. 15a, first n-well 14 and second n-well 154 as well as first p-well 16 and second p-well 156 are formed in semiconductor region 12 as previously described. The n-well region 154 will comprise the collector of the transistor while p-well region 156 comprises the base. The field insulating regions 21 and gate structure 26 and 30 are then formed as illustrated in FIG. 15b Referring now to FIG. 15c, EEPROM source/drain regions 18 and 20 and n-well contact region 15 are formed as previously described. During this step, emitter region 158 and collector contact region 160 are also formed. Likewise, base contact region 162 is formed simultaneously with p-well contact 17. (Possibly as well as substrate contact 13 which is not illustrated). This step is illustrated in FIG. 15d. Once again, the n and p doping steps may be reversed.

Figure 16A:
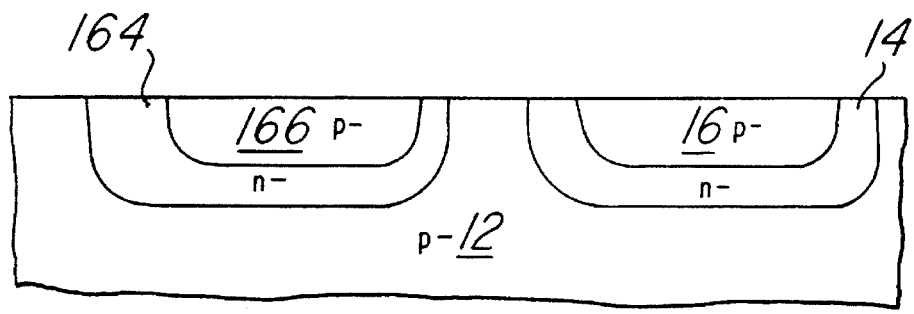
FIGS. 16a–16d are cross-sections of a simultaneously formed floating gate transistor and extended drain transistor at various stages in the fabrication process.
Figure 16B:
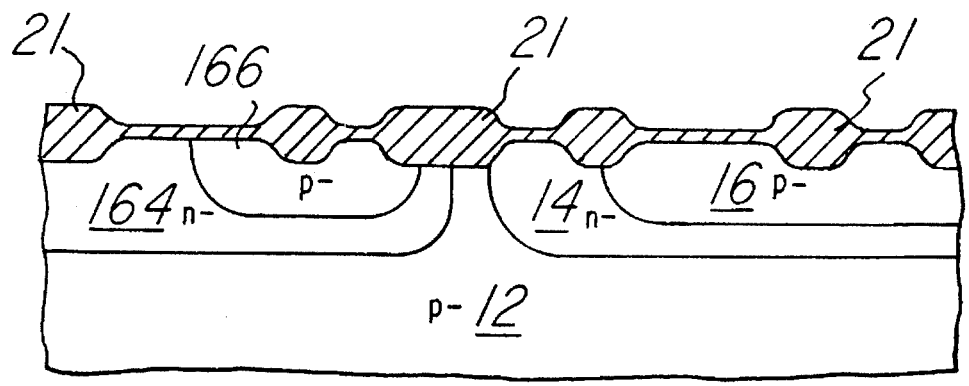

As another example, FIGS. 16a–16d illustrate the simultaneous fabrication of an extended drain field effect transistor and an EEPROM cell. First and second n-well regions 14 and 164 and first and second p-well regions 16 and 166 are formed in semiconductor region 12. Field isolating regions 21 are then formed. These steps are illustrated in FIGS. 16a and 16b.

Figure 16C:
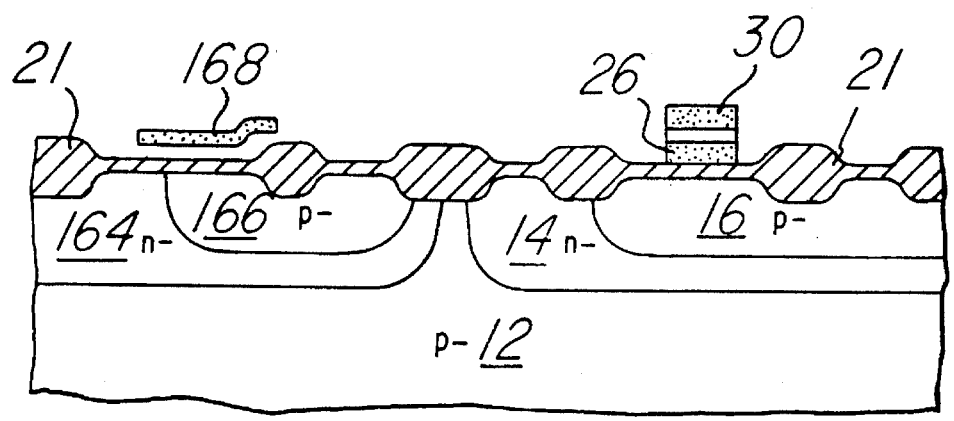

Referring now to FIG. 16c, the gate structure is formed. Transistor gate 158 is formed at the same time as EEPROM floating gate 26. Accordingly, gate 168 may comprise doped polysilicon or a metal such as aluminum.

Figure 16D:
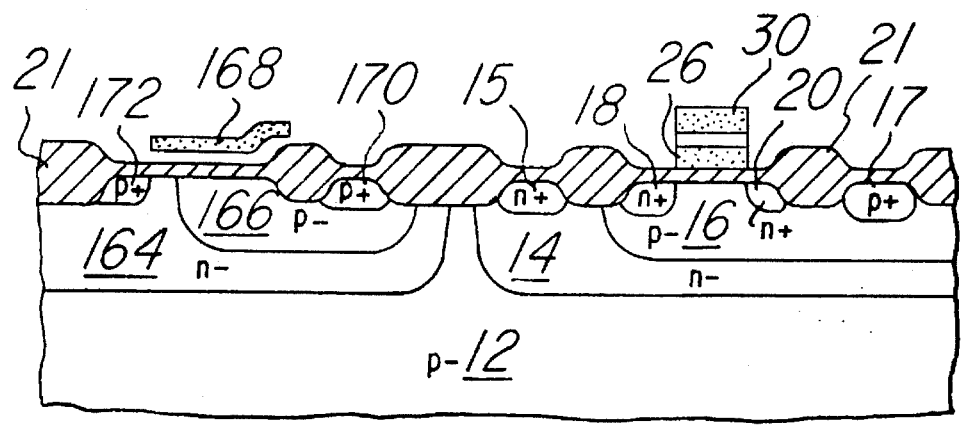

Referring now to FIG. 16d, the highly doped n and p regions are formed. In this embodiment, the source/drain regions 170 and 172 are formed simultaneously with p-well contact region 17 (and possibly substrate contact 13 which is now shown here).

Figure 17:
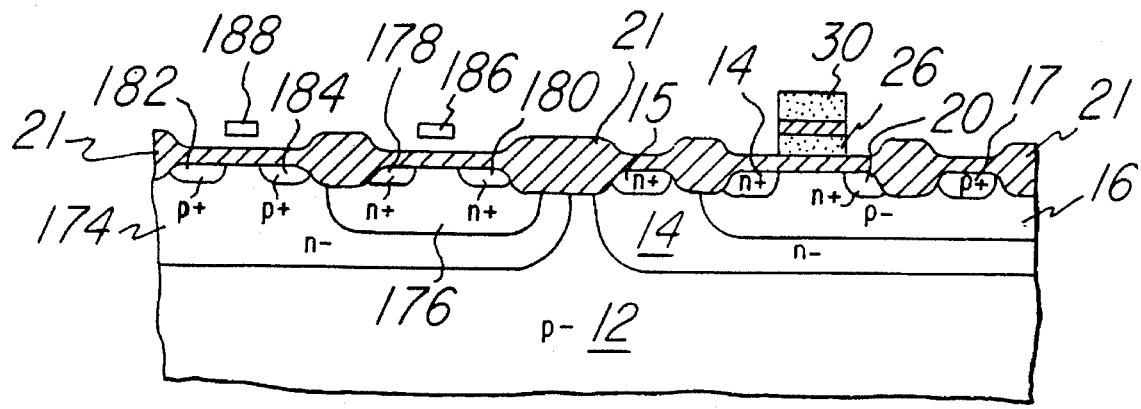
FIG. 17 is a cross-section of a floating gate transistor and a CMOS transistor pair which were formed simultaneously.

FIG. 17 illustrates a CMOS device which has been built simultaneously with a EEPROM device. The intervening process steps have not been illustrated since they correspond with the steps already illustrated in FIGS. 13, 15 and 16. The p-channel device of the CMOS transistor pair is formed n-well 174. The p-channel device comprises n-doped source/drain regions 182 and 184 which are separated by a channel region 183. Gate 188 overlies channel 183. The source/drain regions 182 and 184 were formed at the same time as p-contact 17. The gate was formed at the same time as floating gate 26.

The n-channel transistor of the CMOS pair is formed in p-well 176. The n-channel transistor comprises source/drain regions 178 and 180 which are separated by channel 179. Gate 186 overlies the channel region. The source/drain regions 178 and 180 were formed simultaneously with n-regions 15, 18 and 20 while the gate 180 was formed simultaneously with floating gate 26 (as well as p-channel gate 188).

Figure 18:
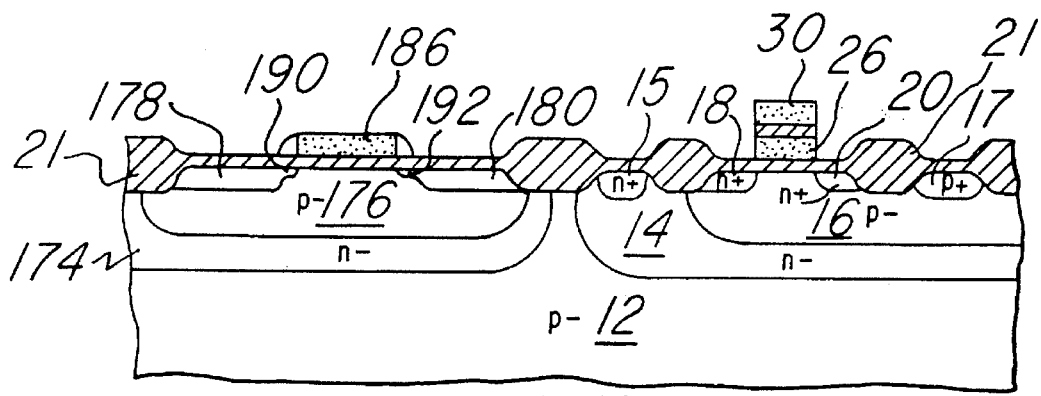
FIG. 18 is a cross-section of a floating gate transistor and a NMOS transistor pair which were formed simultaneously.

FIG. 18 illustrates a NMOS device which has been built simultaneously with a EEPROM device. Once again, the intervening process steps have not been illustrated since they correspond with the steps already illustrated in FIGS. 13, 15 and 16. The NMOS device of FIG. 18 has been illustrated to specifically include lightly doped drain (LDD) regions 190 and 192. It should be noted that these may also be included in the transistors of FIG. 17 or may be omitted in the NMOS device of FIG. 18.

Figure 19:
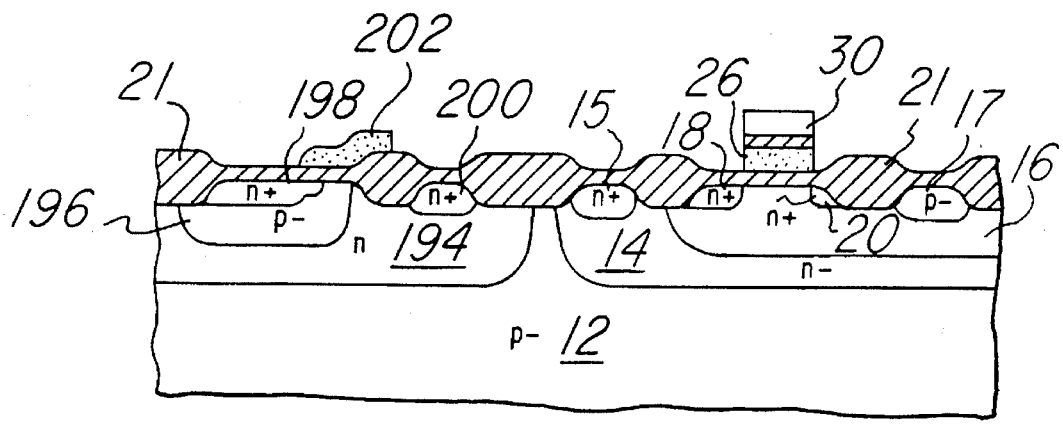
FIG. 19 is a cross section of a floating gate transistor and a DMOS transistor pair which were formed simultaneously.

As a final illustrated example (although other devices could also be incorporated), FIG. 19 illustrates a DMOS device which has been built simultaneously with a EEPROM device. First source/drain region 198 is formed in p-well 196. Second source/drain region 200 is spaced from the first source/drain region 198. The channel of the device is formed within p-well 196. The gate 202 is formed so that it overlies at least a portion of the channel.

It should once again be noted that any combination of the devices described herein can be formed simultaneously. In other words the present invention encompasses forming an EEPROM cell simultaneously with any one, some or all of the devices described herein as well as other devices. The present invention also encompasses combinations of devices which do not include the EEPROM cells.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of writing to a non-volatile memory cell formed in a semiconductor substrate, said method comprising the steps of:

providing an array of non-volatile memory cells formed in rows and columns within a semiconductor region, each said cells comprising a source, a drain and a control gate, wherein each of said control gates in a row of said array are coupled to an associated word line and wherein each of said source/drain regions in a column are coupled to an associated bitline;

holding said semiconductor substrate at a reference voltage potential;

applying a first voltage to the wordline of a non-volatile memory cell to be written to;

applying said reference voltage to the wordlines of other non-volatile memory cells in said array;

applying a second voltage to a bitline of said non-volatile memory cell to be written to, wherein said second voltage is less than said reference voltage potential and wherein said first voltage has the same magnitude as said second voltage; and applying said reference voltage to the bitlines of other non-volatile memory cells in said array.

2. The method of claim 1 wherein said first voltage is about +9 volts and said second voltage is about −9 volts.

3. A method of writing to a non-volatile memory cell formed in a semiconductor substrate, said method comprising the steps of:

providing an array of non-volatile memory cells formed in rows and columns within a semiconductor region, each said cells comprising a source, a drain and a control gate, wherein each of said control gates in a row of said array are coupled to an associated word line and wherein each of said source/drain regions in a column are coupled to an associated bitline;

holding said semiconductor substrate at a reference voltage potential;

applying a first voltage to the wordline of a non-volatile memory cell to be written to;

applying said reference voltage to the wordlines of other non-volatile memory cells in said array;

applying a second voltage to a bitline of said non-volatile memory cell to be written to, wherein said second voltage is less than said reference voltage potential and wherein the difference between said first voltage and said second voltage is about 18 volts; and applying said reference voltage to the bitlines of other non-volatile memory cells in said array.

4. The method of claim 3 wherein said reference voltage potential is about zero volts, said first voltage is about +9 volts and said second voltage is about −9 volts.

5. The method of claim 3 wherein more than one cell is written to simultaneously by applying said first voltage to the wordline of a each non-volatile memory cell to be written to and applying said second voltage to the bitline of each non-volatile memory cell to be written to:

6. A method of writing to a non-volatile memory cell formed in a semiconductor substrate, said cell comprising a source, a drain and a control gate, said source and drain being formed in a semiconductor region, said semiconductor region being isolated from said substrate said method comprising the steps of:

holding said semiconductor substrate at a reference voltage potential;

applying a first voltage to said control gate of said non-volatile memory cell; and applying a second voltage to said source of said non-volatile memory cell, wherein said second voltage is less than said reference voltage potential and wherein said first voltage has the same magnitude of said second voltage.

7. The method of claim 6 wherein said first voltage is about +9 volts and said second voltage is about −9 volts.

8. The method of claim 6 and further comprising the step of applying a third voltage to said semiconductor region, said third voltage less than said reference voltage.

9. The method of claim 6 and further comprising the step of applying said second voltage to said semiconductor region.

10. A method of writing to a non-volatile memory cell formed in a semiconductor substrate, said cell comprising a source, a drain and a control gate, said source and drain being formed in a semiconductor region, said semiconductor region isolated from said semiconductor substrate, said method comprising the steps of:

holding said semiconductor substrate at a reference voltage potential;

applying a first voltage to said control gate of said non-volatile memory cell; and applying a second voltage to said source of said non-volatile memory cell, wherein said second voltage is less than said reference voltage potential and wherein the difference between said first voltage and said second voltage is about 18 volts.

11. The method of claim 10 wherein said reference voltage potential is about zero volts, said first voltage is about +9 volts and said second voltage is about −9 volts.

12. The method of claim 6 and further comprising the step of applying a third voltage to said semiconductor region, said third voltage less than said reference voltage.

13. The method of claim 6 and further comprising the step of applying said second voltage to said semiconductor region.

14. A method of simultaneously programming a plurality of non-volatile memory cells in an array formed in a substrate, said method comprising the steps of:

providing an array of non-volatile memory cells formed in rows and columns within a semiconductor region, said semiconductor region isolated from said substrate, each said cells comprising a source, a drain and a control gate, wherein each of said control gates in a row of said array are coupled to an associated word line and wherein each of said source/drain regions in a column are coupled to an associated bitline;

holding said substrate at a reference voltage potential;

applying a first voltage to the wordlines of each of said non-volatile memory cells to be written to; and applying a second voltage to said bitlines of said non-volatile cells to be written to, said second voltage less than said reference voltage potential and having the same magnitude as said first voltage.

15. A method of programming a non-volatile memory cell comprising the steps of:

providing a semiconductor substrate which includes at least one non-volatile memory cell formed therein, said non-volatile memory cell being formed within a semiconductor region which is isolated from said semiconductor substrate, said non-volatile memory cell comprising a source and a drain disposed within said semiconductor and also comprising a control gate;

applying a positive voltage to said control gate of said non-volatile memory cell;

applying a negative voltage to said source region of said non-volatile memory cell; and applying a negative voltage to said semiconductor region.

16. The method of claim 15 wherein the voltage applied to the source region is equal to the voltage applied to the semiconductor region.

17. The method of claim 15 and further comprising the step of applying a ground voltage to said semiconductor substrate.

* * * * *